US006682976B2

(12) United States Patent
Satou et al.

(10) Patent No.: US 6,682,976 B2
(45) Date of Patent: Jan. 27, 2004

(54) METHOD FOR MANUFACTURING A NONVOLATILE SEMICONDUCTOR MEMORY DEVICE

(75) Inventors: Yasushi Satou, Tokyo (JP); Hiroshi Asaka, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 121 days.

(21) Appl. No.: 09/945,720

(22) Filed: Sep. 5, 2001

(65) Prior Publication Data

US 2002/0034850 A1 Mar. 21, 2002

(30) Foreign Application Priority Data

Sep. 6, 2000 (JP) ........................................ 2000-269588

(51) Int. Cl.[7] ............................................. H01L 21/336
(52) U.S. Cl. .................... 438/257; 438/259; 438/261; 438/294; 438/297; 438/298; 438/201; 438/306; 438/593; 438/278; 257/315; 257/321
(58) Field of Search ................................. 438/257, 278, 438/174, 428, 455, 259, 261, 201, 211, 593, 294, 297, 298; 257/315, 321

(56) References Cited

U.S. PATENT DOCUMENTS 3,895,966 A * 7/1975 MacDougall et al. ........ 438/278
5,663,084 A * 9/1997 Yi et al. ....................... 438/453
6,355,524 B1 * 3/2002 Tuan et al. ................... 438/257
6,472,259 B1 * 10/2002 Naito et al. .................. 438/201
6,570,215 B2 * 5/2003 Tuan et al. ................... 257/315

* cited by examiner

Primary Examiner—Matthew Smith
Assistant Examiner—Belur V Keshavan
(74) Attorney, Agent, or Firm—Volentine Francos, PLLC

(57) ABSTRACT

A method for manufacturing a semiconductor memory device includes forming an isolation layer adjacent a diffusion region over a substrate that also has a stacked gate region. A gate oxide layer is formed over the gate region; a first conductive layer over the isolation and gate oxide layers and the diffusion region; a nitride layer over the first conductive layer, the nitride layer having an opening at the isolation layer; and an oxide region in the first conductive layer using the nitride layer as a mask. After removing the nitride layer and the silicon oxide region, an interelectrode dielectric layer is formed over the first conductive layer, and a second conductive layer is formed over the interelectrode dielectric layer. Then, the interelectrode dielectric layer and the first conductive layer over the diffusion portion are removed and a diffusion layer is formed in the substrate of the diffusion portion.

13 Claims, 22 Drawing Sheets

Fig. 23 (A) PRIOR ART
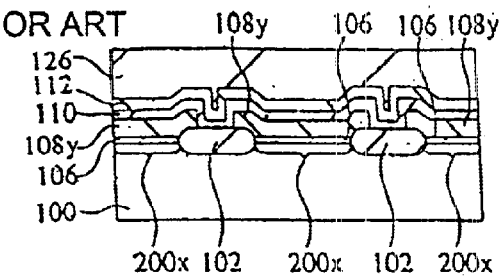
Fig. 23 (E) PRIOR ART
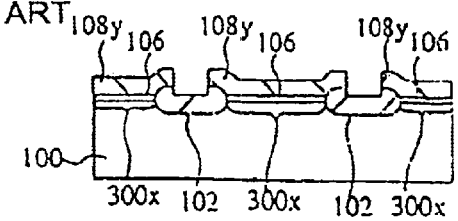
Fig. 23 (B) PRIOR ART
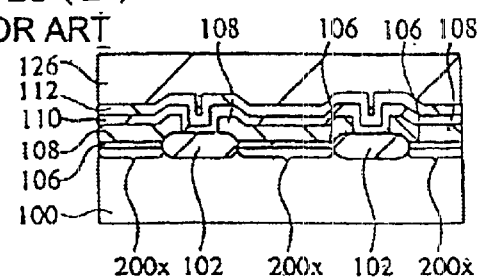
Fig. 23 (F) PRIOR ART
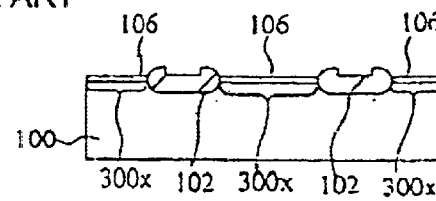
Fig. 23 (C) PRIOR ART
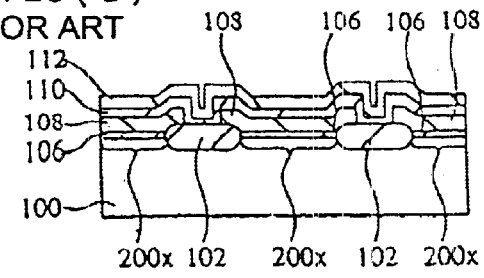
Fig. 23 (G) PRIOR ART
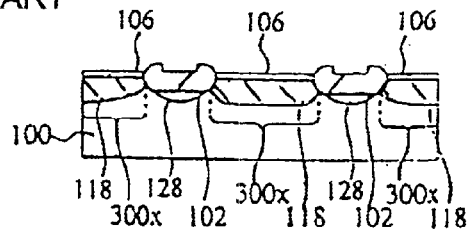
Fig. 23 (D) PRIOR ART
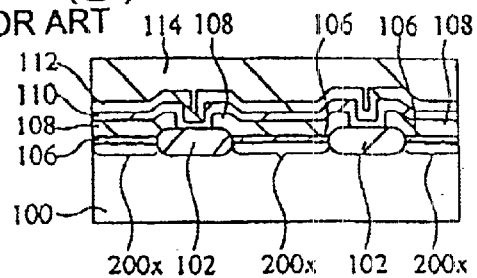
Fig. 23 (H) PRIOR ART
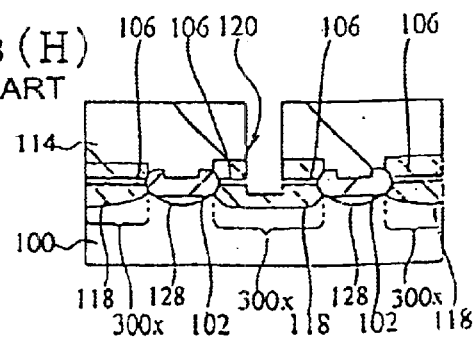

METHOD FOR MANUFACTURING A NONVOLATILE SEMICONDUCTOR MEMORY DEVICE

The present application claims priority under 35 U.S.C. §119 to Japanese Application No.2000-269588 filed on Sep. 6, 2000, which is hereby incorporated by reference in its entirely for all purposes.

BACKGROUND OF THE INVENTION

1. Field of the Invention

The present invention relates to a method for manufacturing a nonvolatile A semiconductor memory device such as an EEPROM (Electrically Erasable Programmable Read Only Memory).

2. Description of the Related Art

An EEPROM is conventionally used as a nonvolatile semiconductor memory. FIG. 19, FIGS. 20(A) and (B) show a conventional memory cell of the EEPROM. FIG. 19 shows a top view, FIG. 20(A) shows a cross sectional view along I—I line of FIG. 19, and FIG. 20(B) shows a cross sectional view along II—II line of FIG. 19.

A memory cell of the nonvolatile semiconductor memory device has a stacked gate portion 200 as shown in FIG. 19 and FIG. 20(A). The memory cell has a diffusion portion 300, which is formed at a peripheral portion of the stacked gate portion 200 as shown in FIG. 19 and FIG. 20(B). A stacked gate is formed between isolation layers 102. The isolation layers 102 are formed over a p-type silicon substrate 100. The stacked gate portion 200 has a gate oxide layer 106, a first gate electrode (floating gate electrode) 108, an interelectrode dielectric layer 110, a second gate electrode (control gate electrode) 112, an intermediate insulating layer 114 and an interconnection 116. The gate oxide layer 106 is formed over the silicon substrate 100. The first gate electrode 108 is formed over the gate oxide layer 106. The interelectrode dielectric layer 110 is formed over the first gate electrode 108. The second gate electrode 112 is formed over the interelectrode dielectric layer 110. The intermediate insulating layer 114 is formed over the second gate electrode 112.

The diffusion portion 300 has the isolation layers 102, a diffusion layer 118, the gate oxide layer 106, the intermediate insulating layer 114 and a contact hole 120 as shown in FIG. 20(B). The diffusion layer 118 is formed in the silicon substrate 100. The gate oxide layer 106 is formed over the silicon substrate 100. The intermediate insulating layer 114 is formed over the isolation layers 102. An interconnecting metal is filled in the contact hole 120, and forms the interconnection 116.

FIGS. 21 (A)–23(H) show a method for manufacturing the conventional EEPROM. FIGS. 21(A)–(E), FIGS. 22(A)–(D) and FIGS. 23(A)–(D) correspond to line I—I of FIG. 19. FIGS. 21(F)–(J), FIGS. 22(E)–(H) and FIGS. 23(E)–(H) correspond to line II—II of FIG. 19.

The isolation layers 102 are formed over the silicon substrate 100. Active regions 200x and 300x are formed over the silicon substrate 100 in this process as shown in FIG. 21 (A) and FIG. 21(F). The gate oxide layer 106 is formed over active regions 200x and 300x as shown in FIG. 21(B) and FIG. 21(G). A first polysilicon layer 108x is formed over the isolation layer 102 and the gate oxide layer 106 as shown in, FIG. 21(C) and FIG. 21(H). The first polysilicon layer 108x is used as the first gate electrode 108.

A resist pattern 124 is formed over the first polysilicon layer 1 08x as shown in FIG. 21(D) and FIG. 21(I). The resist pattern 124 has an opening 122 over the isolation layer 102. An etching is performed using the resist pattern 124 as a mask. The first polysilicon layer 108x is separated in this etching as designed by reference number 108y shown in FIG. 21(E) and FIG. 21(J).

The interelectrode dielectric layer 110x is formed over the silicon substrate 100 after the resist pattern 124 is removed as shown in FIG. 22(A) and FIG. 22(E). A second polysilicon layer 112x is formed over the interelectrode dielectric layer 110x as shown in FIG. 22(B) and FIG. 22(F).

A resist pattern 126 is formed over the stacked gate portion 200x as shown in FIG. 22(C) and FIG. 22(G). An etching is performed using the resist pattern 126 as a mask. The second polysilicon layer 112x over the diffusion portion 300x is removed by this etching as shown in FIG. 22(H), and the second polysilicon layer 112 formed over the stacked gate portion 200x remains as shown in FIG. 22(D). Then, etchings are performed using the resist pattern 126 as a mask. The interelectrode dielectric layer 110x and the first polysilicon layer 108y over the diffusion portion 300x are removed, as shown in FIGS. 23(A), (B), (E) and (F).

The resist pattern 126 is removed, and an implantation of ions (for example As) is performed. Then, a thermal diffusion is performed. The diffusion layer 118 at the diffusion portion 300x is formed by this process as shown in FIG. 23(C) and FIG. 23(G). A BPSG (Boron-Phosphate-Silicate-Glass) layer as the intermediate insulating layer 114 is formed over the silicon substrate 100. A resist pattern (not shown in FIG. 23) is formed over the intermediate insulating layer. The resist pattern has an opening over the diffusion layer 118. An etching is performed using the resist pattern as a mask. This etching forms the contact hole 120 as shown in FIG. 23(D) and FIG. 23(H). The contact hole 120 is filled a metal layer. The metal layer is also formed over the intermediate insulating layer 114. The metal layer is patterned according to a pattern of the interconnect 116.

However, in the conventional nonvolatile semiconductor memory device, a concave portion is formed in the isolation layer 102 of the diffusion portion 300 during the etching of the interelectrode dielectric layer 110. Therefore, ions are introduced under the isolation layer 102. This causes a formation of an unnecessary diffusion layer 128, and adjacent diffusion portions are connected each other.

SUMMARY OF THE INVENTION

A method for manufacturing a semiconductor memory device includes forming an isolation layer over a semiconductor substrate having a stacked gate region and a diffusion region, the isolation layer is formed adjacent the diffusion region of the semiconductor substrate. The method further includes forming a gate oxide layer over the gate stacked region, forming a first conductive layer over the isolation layer, the gate oxide layer and the diffusion region, forming a nitride layer over the first conductive layer the nitride layer having an opening at the isolation layer, forming an oxide region in the first conductive layer using the nitride layer as a mask, removing the nitride layer and the silicon oxide region, forming an interelectrode dielectric layer over the first conductive layer, forming a second conductive layer over the interelectrode dielectric layer, the second conductive layer over the diffusion portion, removing the interelectrode dielectric layer over the diffusion portion, removing the first conductive layer over the diffusion portion and forming diffusion layer in the silicon substrate of the diffusion portion.

BRIEF DESCRIPTION OF THE DRAWINGS

FIG. 1(A) shows a cross sectional view along an I—I line of FIG. 2.

FIG. 1(B) shows a cross sectional view along an II—II line of FIG. 2.

FIGS. 3(A)–(C) correspond to the FIG. 1(A). FIGS. 3(D)–(F) correspond to the FIG. 1(B).

FIGS. 4(A)–(C) correspond to the FIG. 1(A). FIGS. 4(D)–(F) correspond to the FIG. 1(B).

FIGS. 5(A)–(C) correspond to the FIG. 1(A). FIGS. 5(D)–(F) correspond to the FIG. 1(B).

FIGS. 6(A)–(C) correspond to the FIG. 1(A). FIGS. 6(D)–(F) correspond to the FIG. 1(B).

FIGS. 7(A)–(D) correspond to a stacked gate portion. FIGS. 7(E)–(H) and correspond to a diffusion portion.

FIGS. 8(A)–(C) correspond to the stacked gate portion. FIGS. 8(D)–(F) correspond to the diffusion portion.

FIGS. 9(A)Y(F) show a method for manufacturing of a fourth preferred embodiment. FIGS. 9(A)–(C) correspond to the stacked gate portion. FIGS. 9(D)–(F) correspond to the diffusion portion.

FIGS. 10(A)–(B) correspond to the stacked gate portion. FIGS. 10(C)–(D) correspond to the diffusion portion.

FIGS. 11 (A)–(D) correspond to the stacked gate portion. FIGS. 11 (E)–(H) correspond to the diffusion portion.

FIGS. 12(A)–(D) correspond to the stacked gate portion. FIGS. 12(E)–(H) correspond to the diffusion portion.

FIGS. 13(A)–(D) correspond to the stacked gate portion. FIGS. 13(E)–(H) correspond to the diffusion portion.

FIGS. 14(A)–(D) correspond to the stacked gate portion. FIGS. 14(E)–(H) correspond to the diffusion portion.

FIGS. 15(A)–(C) correspond to the stacked gate portion. FIGS. 15(D)–(F) correspond to the diffusion portion.

FIGS. 16(A)–(C) correspond to the stacked gate portion. FIGS. 16(D)–(F) correspond to the diffusion portion.

FIGS. 17(A)–(D) correspond to the stacked gate portion. FIGS. 17(E)–(H) correspond to the diffusion portion.

FIGS. 18(A)–(D) correspond to the stacked gate portion. FIGS. 18(E)–(H) correspond to the diffusion portion.

FIG. 19 shows a top view of the conventional nonvolatile semiconductor memory device.

FIG. 20(A) shows a cross sectional view along I—I line of FIG. 19, and FIG. 20(B) shows a cross sectional view along II—II line of FIG. 19.

FIGS. 21 (A)–(E) show a method for manufacturing the conventional nonvolatile semiconductor memory.

FIGS. 22(A)–(D) correspond to line I—I of FIG. 19. FIGS. 22(E)–(H) correspond to line II—II of FIG. 19.

FIGS. 23(A)–(H) show the method for manufacturing the conventional nonvolatile semiconductor memory. FIGS. 23(A)–(D) correspond to line I—I of FIG. 19. FIGS. 23(E)–(H) correspond to line II—II of FIG. 19.

DETAILED DESCRIPTION OF THE DRAWINGS

First embodiment

Figure 1:
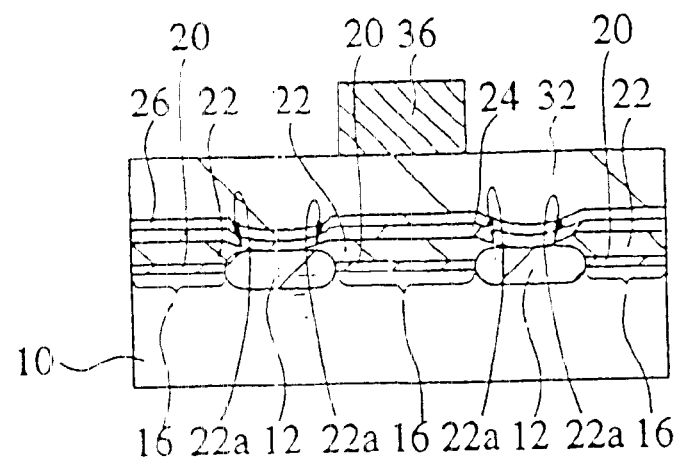
FIGS. 1(A)–(B) show a nonvolatile semiconductor memory device of a first preferred embodiment.
Figure 1:
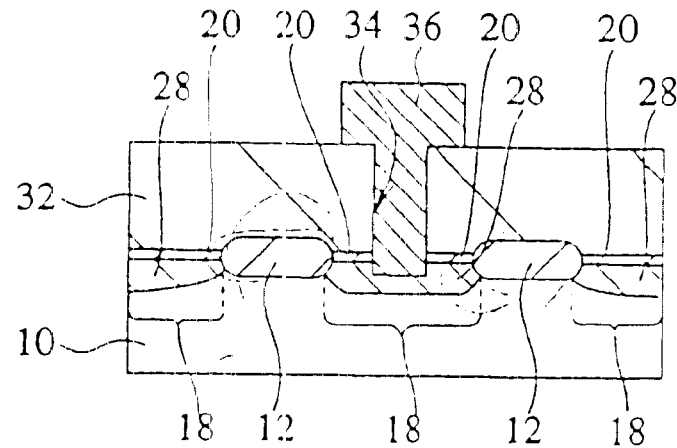
Figure 2:
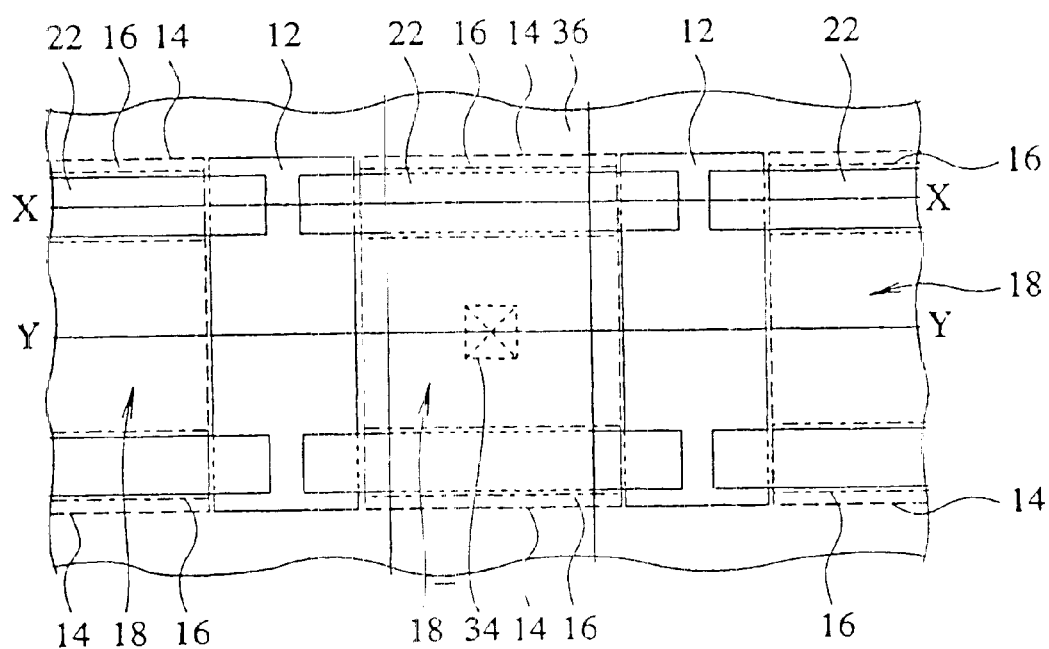
FIG. 2 shows a top view of the nonvolatile semiconductor memory device of the first preferred embodiment.

FIG. 1 shows a nonvolatile semiconductor memory device of a first embodiment. FIGS. 1(A) and 1(B) are cross sectional views of the nonvolatile semiconductor memory device of the first preferred embodiment. FIG. 2 shows a top view of the nonvolatile semiconductor memory device of the first preferred embodiment. FIG. 1(A) shows a cross sectional view along an X—X line of FIG. 2. FIG. 1(B) shows a cross sectional view along an Y—Y line of FIG. 2.

The semiconductor memory device has a p-type silicon substrate 10 (not shown in FIG. 2), an isolation layer 12, a stacked gate portion 16 and a diffusion portion 18 as shown in FIG. 2. The stacked gate portion 16 has a gate oxide layer 20, a first polysilicon gate 22 formed over the gate oxide layer 20, an interelectrode dielectric layer 24 formed over the first gate electrode 22 and a second gate electrode 26 formed over the interelectrode dielectric layer 24 as shown in FIG. 1(A). The intermediate insulating layer 32 is formed over the second gate electrode 26 and an interconnection 36 is formed over the intermediate insulating layer 32 as shown in FIG. 1(A). The diffusion portion 28 has an isolation layer 12, a diffusion layer 28, a gate oxide layer 20 formed over the diffusion layer 28, an intermediate insulating layer 32, a contact hole 34 and an interconnection 36. The intermediate insulating layer 32 is formed over the gate oxide layer 20 and the isolation layer 12. The contact hole 34 is formed in the intermediate insulating layer 32. An interconnecting metal is filled in the contact hole 34 and connected to the diffusion layer 28, and the interconnecting material also forms the interconnection 36. The first gate electrode of the semiconductor memory device has a tapered shape in side surfaces 22a as shown in FIG. 1(A).

FIGS. 3(A)–(C), FIGS. 4(A)–(C) and FIGS. 5(A)–(C) show a method for manufacturing the semiconductor memory device. FIGS. 3(A)–(C), FIGS. 4(A)–(C) and FIGS. 5(A)–(C) correspond to the FIGS. 1(A). FIGS. 3(D)–(F), FIGS. 4(D)–(F) and FIGS. 5(D)–(F) show a method for manufacturing the semiconductor memory device. FIGS. 3(D)–(F), FIGS. 4(D)–(F) and FIGS. 5(D)–(F) correspond to the FIGS. 1(B).

Figure 3A:
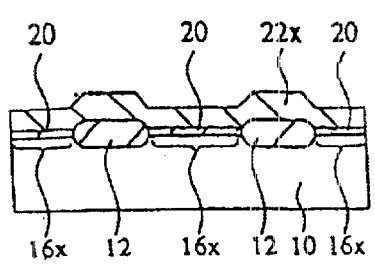
FIGS. 3(A)–(F) show a method for manufacturing the nonvolatile semiconductor memory device of the first preferred embodiment.

The isolation layer 12 is partly formed over the semiconductor substrate 10 using a LOCOS method, and this results in the formation of active regions at the stacked gate portion 16x and the diffusion portion 18x. The gate oxide layer 20 is formed over the active regions 16x. The gate oxide layer 20 is formed using a thermal oxidation. The first polysilicon layer 22x is formed over the isolation layer 12 and the gate oxide layer 20. The first polysilicon layer 22x is formed over the whole surface of the silicon substrate 10 using a LP-CVD method as shown in FIG. 3(A) and FIG. 3 (D).

Figure 3B:
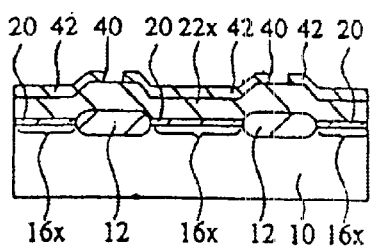
Figure 3C:
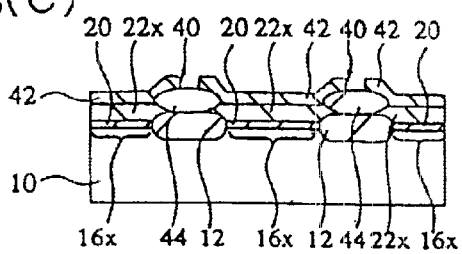

Then, a nitride layer 42 is formed over the first polysilicon layer 22x. A resist pattern.(not shown) is formed on the nitride layer 42. A photolithography is performed, and the resist pattern is patterned to have openings corresponding to the isolation layers 12. The nitride layer 42 is etched using the resist pattern as a mask. The nitride layer 42 is patterned to have openings 40 corresponding to the isolation layers 12 as shown in FIG. 3(B) and FIG. 3(E). Oxidation of the polysilicon layer 22x is performed using the nitride layer 42 as a mask as shown in FIG. 3(C) and FIG. 3(F). A region of the first polysilicon layer 22x, which corresponds to the openings 40 of the nitride layer 42, is oxidized. This region is called a silicon oxide region 44 hereinafter.

Figure 4A:
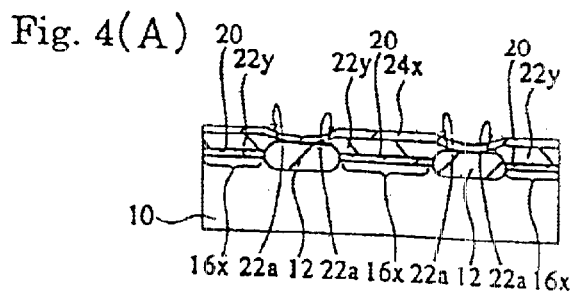
FIGS. 4(A)–(F) show the method for manufacturing the nonvolatile semiconductor memory device of the first preferred embodiment.
Figure 4B:
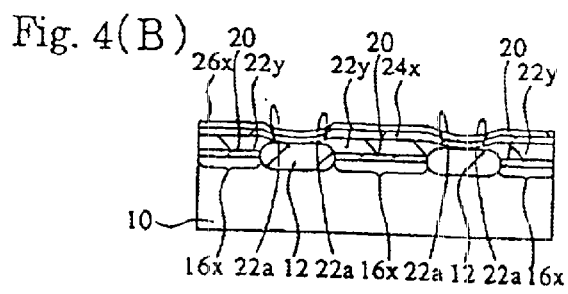
Figure 4C:
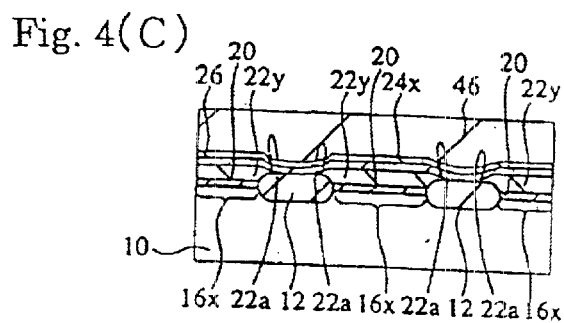
Figure 4D:
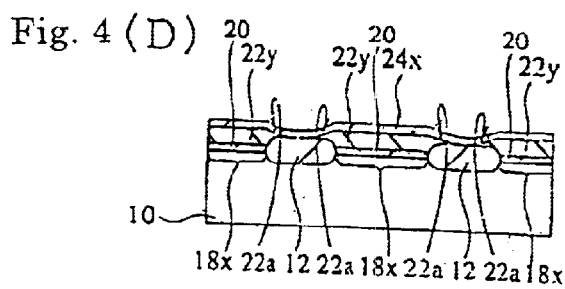

The nitride layer 42 and the silicon oxide region 44 are removed, and the first gate electrode 22y is formed, as shown in FIG. 4(A) and FIG. 4(D). The first gate electrode 22y has a tapered shape on the side surfaces thereof as a result of the thermal oxidation process.

Then, the interelectrode dielectric layer 24x is formed over the whole surface of the silicon substrate 10. The interelectrode dielectric layer 24x has three layers, that is, a first oxide layer, a nitride layer and a second oxide layer (ONO layer). The oxide layers are formed using a thermal oxidation, and the nitride layer is formed using an LP-CVD method as shown in FIGS. 4(A) and 4(D).

Figure 4E:
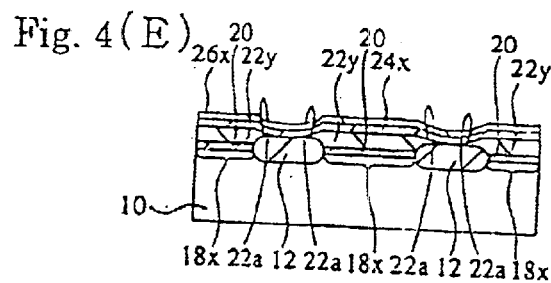
Figure 4F:
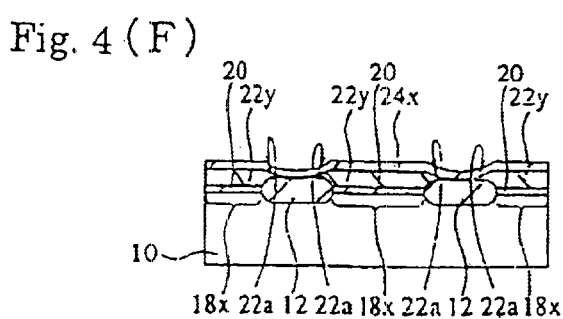
Figure 5:
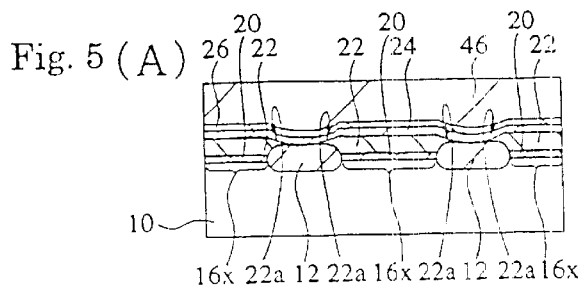
FIGS. 5(A)–(F) show the method for manufacturing the nonvolatile semiconductor memory device of the first preferred embodiment.
Figure 5:
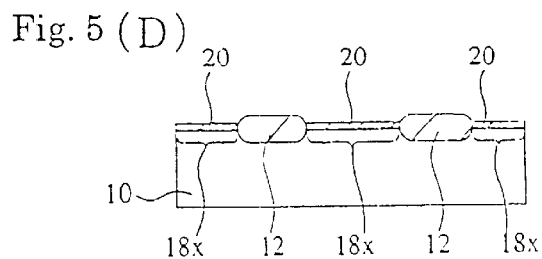
Figure 5:
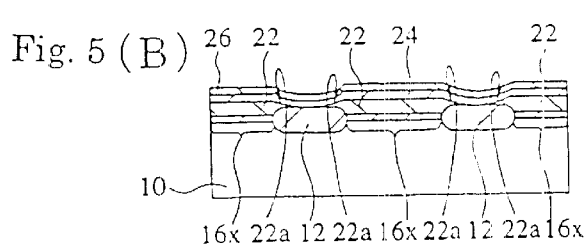
Figure 5:
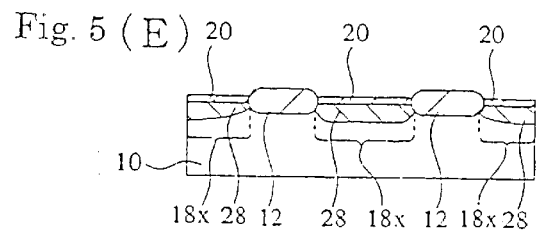
Figure 5:
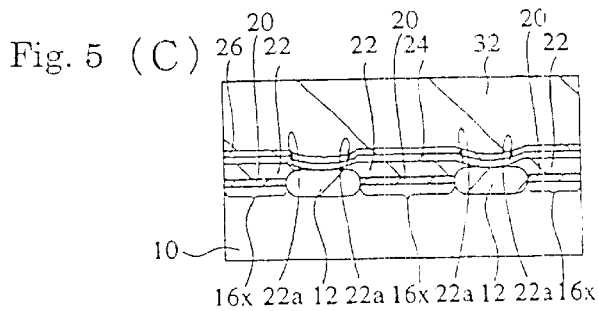
Figure 5:
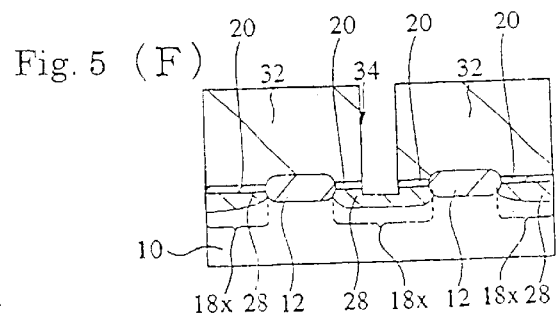

A second polysilicon layer 26x is formed over the interelectrode dielectric layer 24x as shown in FIGS. 4(B) and 4(i). The second polysilicon layer 26x is formed using an LP-CVD method. The second polysilicon layer 26x over the diffusion portion 18x is removed, and the second gate electrode 26 is formed. The removal of the second polysilicon layer 26x is performed by using a photo lithography technique. Therefore, a resist pattern 46 is formed over the semiconductor substrate 10 as shown in FIGS. 4(C) and 4(F). The resist pattern 46 is formed over the stacked gate portion 16x. The resist pattern also covers the isolation layer 12 of the stacked gate portion 16x, and is not formed over the diffusion region 18x. The dry etching is performed using the resist pattern 46 as a mask. As shown in FIG. 5(A) and FIG. 5(D), the interelectrode dielectric layer 24x and the first gate electrode 22y over the diffusion portion 18x are sequentially removed using the resist pattern 46 as a mask.

N-type ions (As) are introduced to the diffusion portion 18x, and are diffused to the diffusion portion 18x. The diffusion layer 28 is formed at the diffusion portion 18x as shown in FIG. 5(E). The diffusion is performed using a thermal diffusion.

The intermediate insulating layer 32 is formed over the semiconductor substrate 10. The intermediate insulating layer 32 is a BPSG layer in the first preferred embodiment. The BPSG layer 32 is formed using a thermal CVD method. A resist pattern is formed over the intermediate insulating layer 32, and the resist pattern has an opening over the diffusion portion 18x. A dry etching is performed using the resist pattern as a mask, and the contact hole 34 is formed in the intermediate insulating layer 32 as shown in FIG. 5(C) and FIG. 5(F). The metal layer for interconnection 36 is formed over the intermediate insulating layer 32, and the contact hole 34 is filled with the metal layer as shown in FIGS. 1(A) and 1(B).

The nonvolatile semiconductor memory device of FIGS. 1(A)–1(B) and FIG. 2 is formed as described above.

In the first preferred embodiment, the side surface portions of the first gate electrode have a tapered shape because of the silicon oxide region. Therefore, the period for removal of the interelectrode dielectric layer 24x is shortened, and the isolation layer reduction of the isolation layer 12 is prevented.

The area of the interelectrode dielectric layer, which contacts to the gate electrodes, is wider than that of the conventional nonvolatile semiconductor memory because of the tapered shape of the side surface portions of the gate electrodes. Therefore, the thickness of the interelectrode dielectric layer 24 can be reduced, and an efficiency of the electron introduction to the first gate electrode can be increased.

Second preferred embodiment

A semiconductor memory device of a second preferred embodiment has a same structure as that of the first preferred embodiment. However, as described below, a method for manufacturing of the second preferred embodiment is different from that of the first preferred embodiment.

Figure 6:
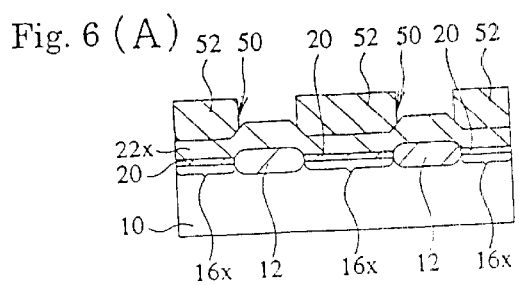
FIGS. 6(A)–(F) show the method for manufacturing the nonvolatile semiconductor memory device of a second preferred embodiment.
Figure 6:
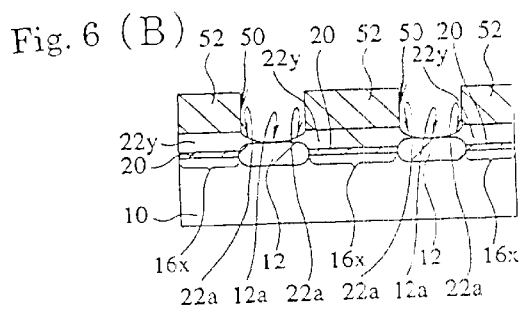
Figure 6:
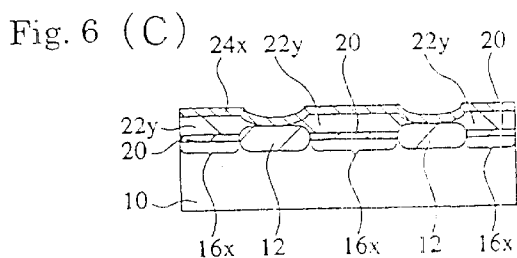
Figure 6:
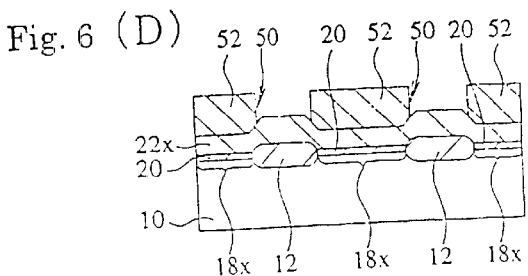
Figure 6:
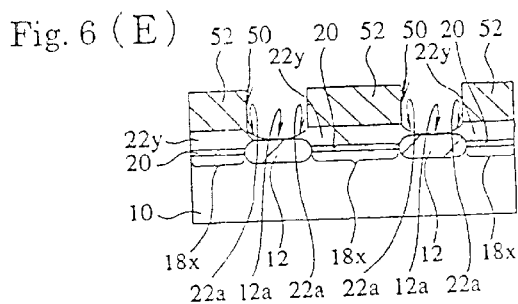
Figure 6:
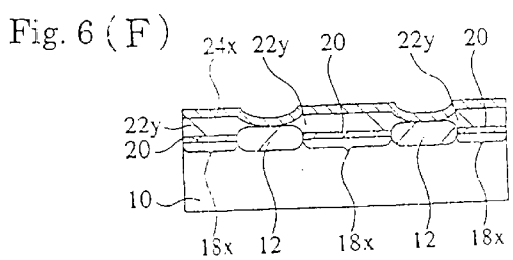

FIGS. 6(A)~(F) show a method for manufacturing the semiconductor memory device. FIGS. 6(A)~(C) correspond to the FIG. 1(A). FIGS. 6(D)~(F) correspond to the FIG. 1(B).

The isolation layer 12 is partly formed over the semiconductor substrate 10, and active regions of the stacked gate portion 16x and the diffusion portion 18x are formed. The gate oxide layer is formed over the active region. The gate oxide layer 20 is formed using a thermal oxidation. The first polysilicon layer 22x is formed over the isolation layer 12 and the gate oxide layer 20 as shown in FIG. 3(A) and FIG. 3 (D). The polysilicon layer 22x is formed over the whole surface of the silicon substrate 10 by using an LP-CVD method.

A resist pattern 52 is formed over the first polysilicon layer 22x as shown in FIG. 6(A) and FIG. 6(D) in the second preferred embodiment. The resist pattern 52 has an opening 50 over the isolation layer 12. A width of the opening is approximately the same as a width of the isolation layer 12.

A wet etching is performed using the resist pattern 52 as a mask. The wet etching is stopped when the surface of the isolation layer 12 is exposed. An etchant of the wet etching is a mixed liquid of $HNO_3$ and HF. The wet etching is an isotropic etching, therefore side surfaces of the first polysilicon layer 22y have a tapered shape as shown in FIG. 6(B) and FIG. 6(E). Then, the resist pattern 52 is removed.

An interelectrode dielectric layer 24x is formed over the first gate electrode 22y as shown in FIGS. 6(C) and 6(F). The interelectrode dielectric layer 24x of the second preferred embodiment is the same as that of the first preferred embodiment (ONO layer). The second polysilicon layer 26x is formed over the interelectrode dielectric layer 24x of FIG. 6(C) and FIG. 6(F) in the same manner as shown in FIGS. 4(B) and 4(E), and etched in the same way of the first preferred embodiment. An etching of the interelectrode dielectric layer 24x and the first gate electrode 22y is then carried out in the same manner as described with respect to FIGS. 4(C), 4(F), 5(A) and 5(D) as in the first preferred embodiment. The resist pattern 46 is removed, and As ions are introduced to the semiconductor substrate 10. The n-type diffusion layer 28 is formed as shown in FIGS. 5(B) and 5(E) after the thermal diffusion. The intermediate insulating layer 32 is formed over the semiconductor substrate 10, and the contact hole 34 is formed in the intermediate insulating layer 32 as shown in FIGS. 5(C) and 5(F). The interconnection 36 formed over the intermediate insulating layer 32.

In the second preferred embodiment, the side surface of the first gate electrode 22 has a tapered shape as a result of the isotropic etching. Therefore, the time period for removal of the interelectrode dielectric layer 24x is shortened, and reduction of the isolation layer 12 is prevented.

The area of the interelectrode dielectric layer, which contacts to the gate electrodes, is wider than in the conventional nonvolatile semiconductor memory in the second preferred embodiment. Therefore, the thickness of the interelectrode dielectric layer 24 can be reduced, and an efficiency of the electron introduction to the first gate electrode can be increased.

Third preferred embodiment

FIGS. 7(A)~(H) and FIGS. 8(A)~(F) show a method for manufacturing of the third preferred embodiment. FIGS. 7(A)~(D) and FIGS. 8(A)~(C) correspond to the stacked gate portion. FIGS. 7(E)~(H) and FIGS. 8(D)~(F) correspond to the diffusion portion. The difference from the other preferred embodiments is mainly described below. As described initially with reference to FIGS. 3(A) and 3(D), the isolation layer 12 is partly formed over the semiconductor substrate 10, and active regions of the stacked gate portion 16x and the diffusion portion 18x are formed. The gate oxide layer 20 is formed over the active region. The gate oxide layer 20 is formed using a thermal oxidation. The first polysilicon layer 22x is formed over the isolation layer 12 and the gate oxide layer 20.

Figure 3D:
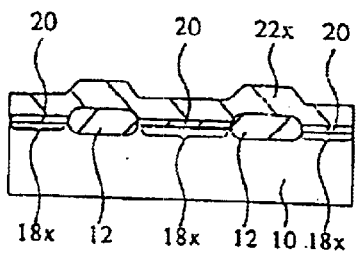
Figure 3E:
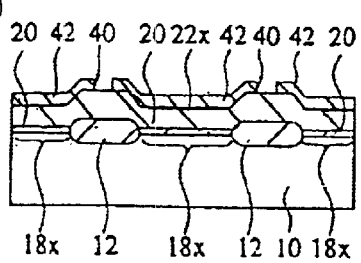
Figure 3F:
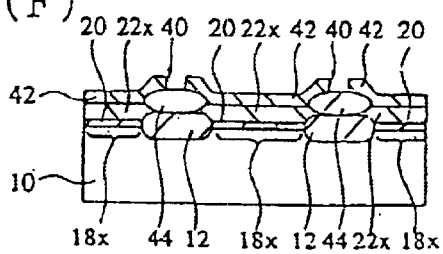

The first polysilicon layer 22x is formed over the whole surface of the silicon substrate 10 using an LP-CVD method as shown in FIG. 3(A) and FIG. 3(D). Then, as described with respect to FIGS. 6(A) and 6(D), a resist pattern 52 is formed over the first polysilicon layer 22x. The resist pattern 52 has an opening 50 over the isolation layer 12.

Figure 7A:
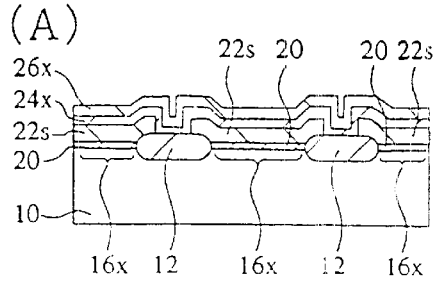
FIGS. 7(A)–(H) show a method for manufacturing of a third preferred embodiment.
Figure 7E:
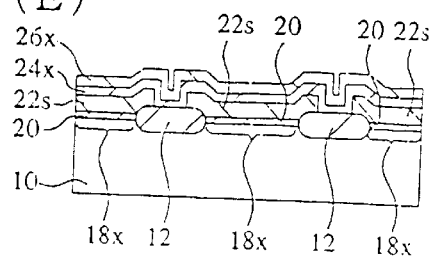
Figure 7B:
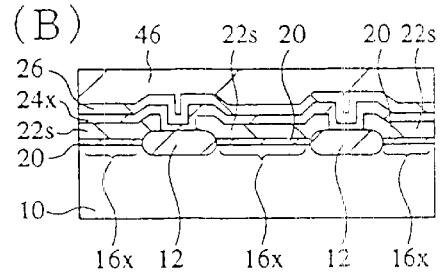

A dry etching is performed using the resist pattern 52 as a mask, and the first gate electrode 22s is formed, as shown in FIG. 7(A) and FIG. 7(E). An interelectrode dielectric layer 24x is formed over the first gate electrode 22s. The interelectrode dielectric layer 24x is the same as that of other preferred embodiments (ONO layer). The second polysilicon layer 26x is formed over the interelectrode dielectric layer 24x as shown in FIG. 7(A) and FIG. 7(D). The second polysilicon layer 26x over the diffusion portion 18x is removed using mask 46, and the second polysilicon layer 26 remains as shown FIG. 7(B) and FIG. 7(E).

In the third embodiment, the wet etching is performed to remove the interelectrode dielectric layer 24x, then, a dry etching is performed to remove the first gate electrode 22s. The oxide layers of the interelectrode dielectric layer (ONO) is removed by using a dilute HF as an etchant. The nitride layer of the interelectrode dielectric layer (ONO) is removed by using a hot phosphoric acid. A mask employed for these etchings is the resist pattern 46, which is formed in the etching of the second polysilicon layer 26x. The wet etching is an isotropic etching, therefore the time period of the removing process is shortened, and the interelectrode dielectric layer 24x is removed easily (FIGS. 7(C) and 7(G)). A dry etching is performed to remove the first gate electrode 22s (FIGS. 7(D) and 7(H)). The interelectrode dielectric layer 24x is removed by wet etching. Therefore, isolation layer reduction is prevented.

Figure 8:
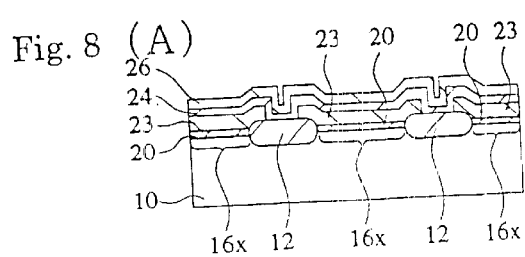
FIGS. 8(A)–(F) show the method for manufacturing of the third preferred embodiment.
Figure 8:
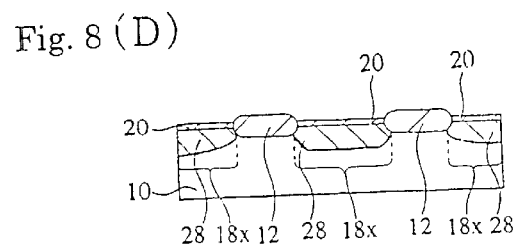
Figure 8:
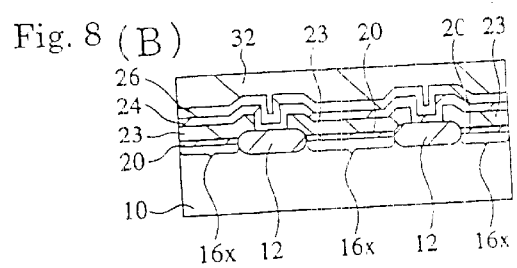
Figure 8:
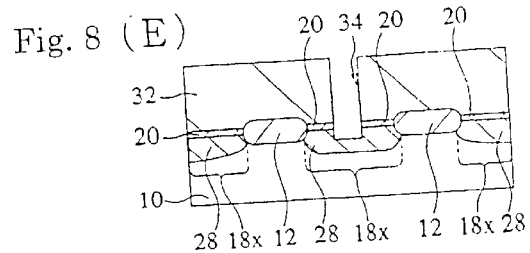
Figure 8:
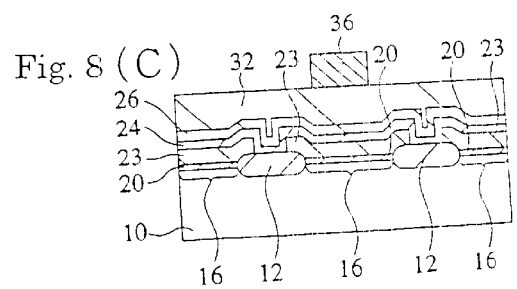
Figure 8:
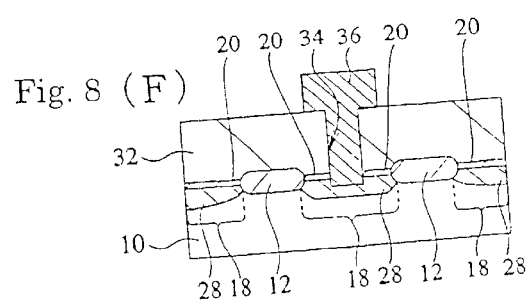

The resist pattern 46 is removed, and As ions are introduced to the semiconductor substrate 10. The diffusion layer 28 is formed in the same way as the first and second preferred embodiments (FIGS. 8(A) and 8(D)). The intermediate insulating layer 32 is formed over the semiconductor substrate 10, and the contact hole 34 is formed in the intermediate insulating layer 32 as shown in FIG. 8(B) and 8(E). The interconnection 36 is formed over the intermediate insulating layer 32 as shown in FIGS. 8(C) and 8(F).

In the third preferred embodiment, the interelectrode dielectric layer 24x is removed by wet etching. Therefore, the isolation layer reduction is prevented.

Fourth embodiment

FIGS. 9(A)~(D) and FIGS. 10(A)~(D) show a method for manufacturing of the fourth preferred embodiment. FIGS. 9(A)~(C) and FIGS. 10(A)~(B) correspond to the stacked gate portion. FIGS. 9(D)~(F) and FIGS. 10(C)~(D) correspond to the diffusion portion. The difference from the other preferred embodiments is mainly described below.

As described initially with respect to FIG. 3(A) and FIG. 3(D), the isolation layer 12 is partly formed over the semiconductor substrate 10, and the active regions of the stacked gate portion 16x and the diffusion portion 18x are formed. The gate oxide layer 20 is formed over the active region. The gate oxide layer 20 is formed using a thermal oxidation. The first polysilicon layer 22x is formed over the isolation layer 12 and the gate oxide layer 20.

The first polysilicon layer 22x is formed over the whole surface of the silicon substrate 10 using an LP-CVD method as shown in FIG. 3(A) and FIG. 3 (D).

Then, as described with respect to FIG. 7(A) and FIG. 7(E), a resist pattern is formed over the first polysilicon layer 22x. The resist pattern has an opening over the isolation layer 12. A dry etching is performed using the resist pattern as a mask, and the first gate electrode 22s is formed. An interelectrode dielectric layer 24x is formed over the first gate electrode 22s. The interelectrode dielectric layer 24x is the same as other preferred embodiments (ONO layer). The second polysilicon layer 26x is formed over the interelectrode dielectric layer 24x as shown in FIG. 7(A) and FIG. 7(D). The second polysilicon layer 26x over the diffusion portion is 18x removed, and the second polysilicon layer 26 remains as shown FIG. 7(B) and FIG. 7(F).

Figure 7F:
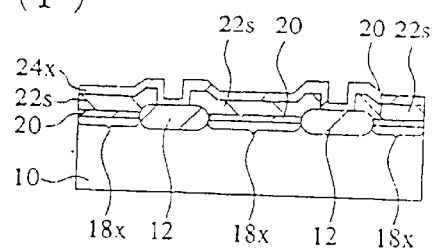
Figure 7C:
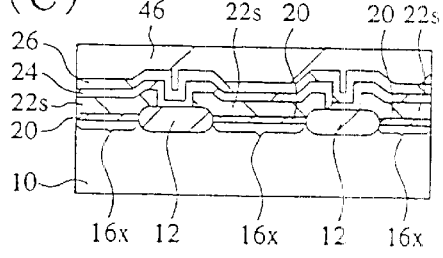
Figure 7G:
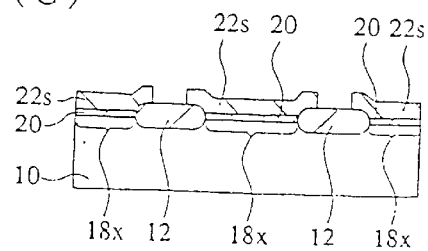
Figure 7D:
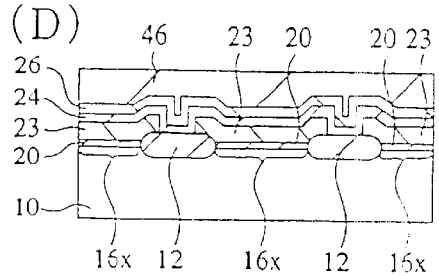
Figure 7H:
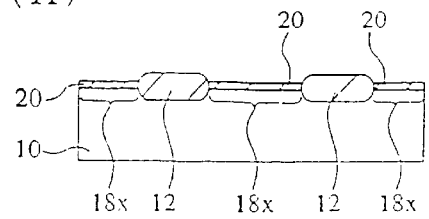
Figure 9:
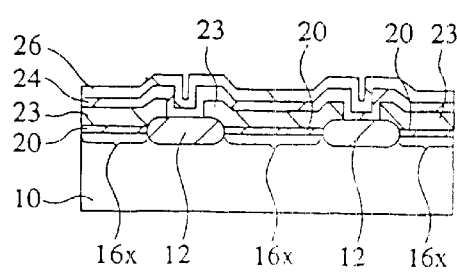
Figure 9:
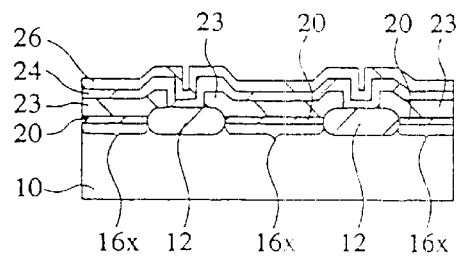
Figure 9:
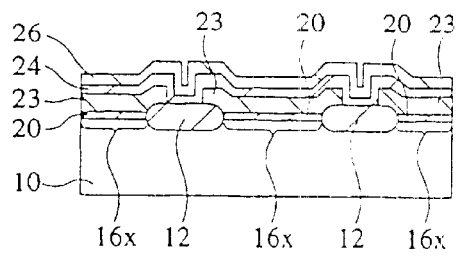
Figure 9:
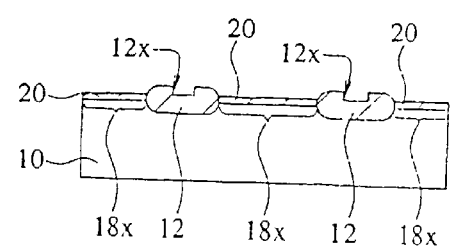
Figure 9:
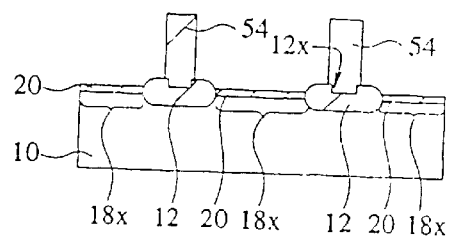
Figure 9:
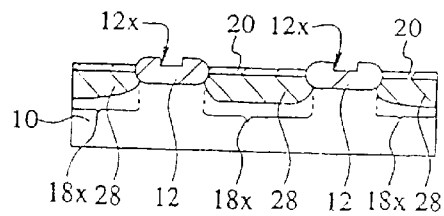

An etching of the interelectrode dielectric layer 24x and the first gate electrode 22s of FIG. 7(F) is performed, to provide the structure as shown in FIGS. 9(A) and 9(D). Therefore, the first gate electrode 23 of the stacked gate portion is formed. This etching results in an isolation layer reduction as shown in FIG. 9(D). A portion of reduction is called a layer reduction portion 12x hereinafter.

The resist pattern, which used in the above described dry etching, is removed, and another resist pattern 54 is formed over the silicon substrate 10 using a photo lithography technique. The resist pattern 54 covers the layer reduction portion 12x as shown in FIG. 9(B) and FIG. 9(E).

The As ions are introduced from the upper side of the substrate 10. Then, the resist pattern 54 is removed. A thermal diffusion is performed, and the diffusion layer 28 is formed as shown in FIG. 9(C) and FIG. 9(F).

Figure 10:
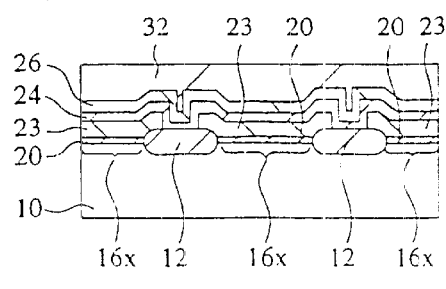
FIGS. 10(A)–(D) show the method for manufacturing of the fourth preferred embodiment.
Figure 10:
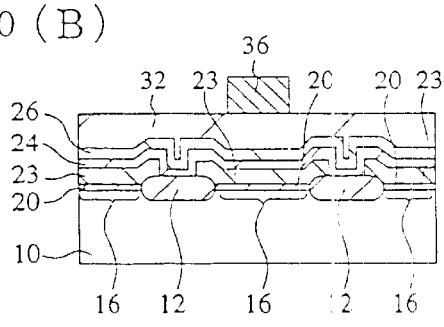
Figure 10:
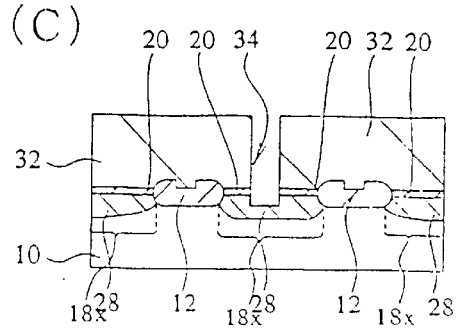
Figure 10:
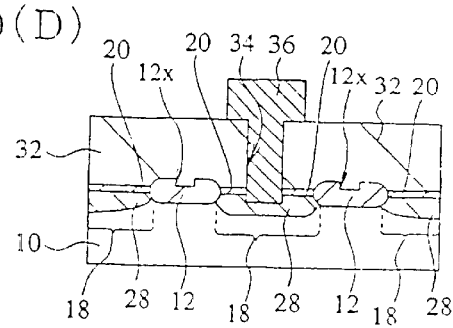

The intermediate insulating layer 32 is formed over the semiconductor substrate 10, and the contact hole 34 is formed in the intermediate insulating layer 32 as shown in FIGS. 10(A) and 10(C). The interconnection 36 is formed over the intermediate insulating layer 32 as shown in FIG. 10(B) and FIG. 10(D).

The resist pattern 54 is formed over the layer reduction portion 12x while As ions are introduced. Therefore, diffusion under the isolation layer is prevented.

Fifth embodiment

Figure 11:
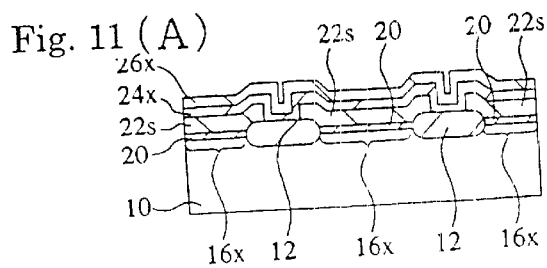
FIGS. 11 (A)–(H) show a method for manufacturing of a fifth preferred embodiment.
Figure 11:
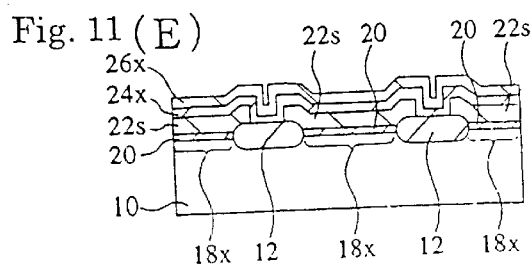
Figure 11:
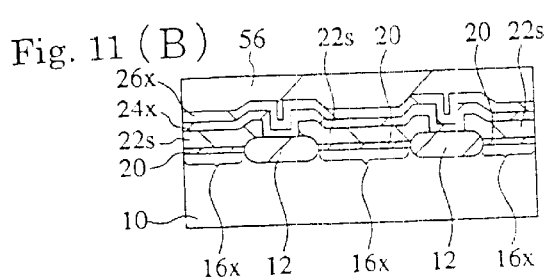
Figure 11:
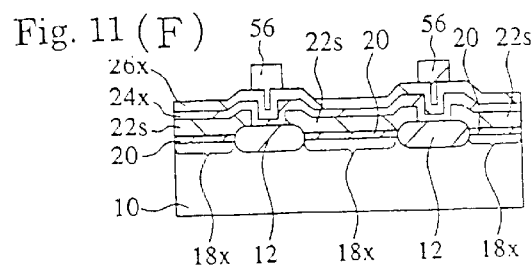
Figure 11:
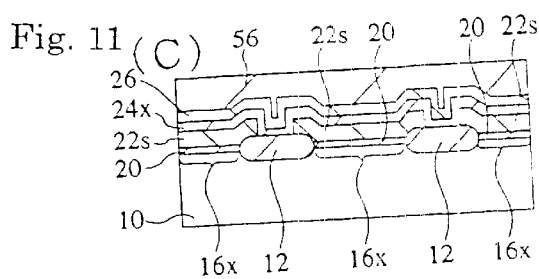
Figure 11:
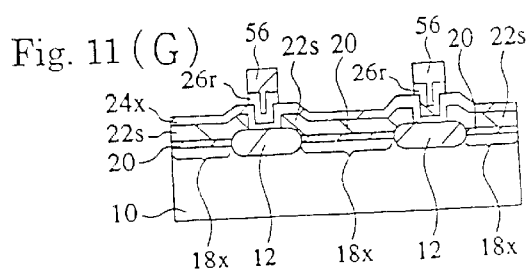
Figure 11:
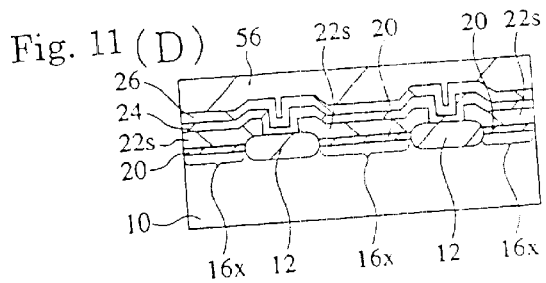
Figure 11:
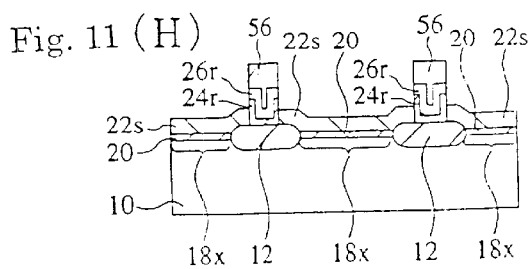

FIGS. 11 (A)~(H) and FIGS. 12(A)~(H) show a method for manufacturing the semiconductor memory device of the fifth preferred embodiment. FIGS. 11 (A)~(D) and FIGS. 12(A)~(D) correspond to the stacked gate portion. FIGS. 11 (E)~(H) and FIGS. 12(E)~(H) correspond to the diffusion portion. The difference between this embodiment and the other preferred embodiments is described below. The formation of the isolation layer 12, the first polysilicon layer 22s and the interelectrode dielectric layer 24x is performed in the same way as in the other embodiments. Then, the second polysilicon layer 26x is formed over the interelectrode dielectric layer 24x as shown in FIG. 11 (A) and FIG. 11 (E). In the fifth preferred embodiment, a resist pattern 56 is formed over the second polysilicon layer 26x. The resist pattern 56 covers the stacked gate portion 16x and the isolation layer of the diffusion portion 18x. That is to say, the resist pattern 56 has an opening corresponding to an active region of the diffusion portion 18x as shown in FIG. 11(B) and FIG. 11 (F).

An etching of the second polysilicon layer 26x is performed using the resist pattern 56 as a mask. The second polysilicon layer 26 remains over the stacked gate portion 16x and the second polysilicon layer 26r remains over the isolation layer 12 as shown in FIG. 11(C) and FIG. 11(G).

Figure 12:
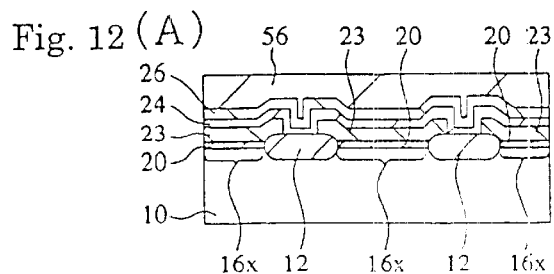
FIGS. 12(A)–(H) show the method for manufacturing of the fifth preferred embodiment.
Figure 12:
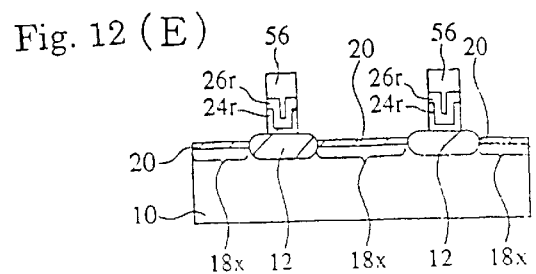
Figure 12:
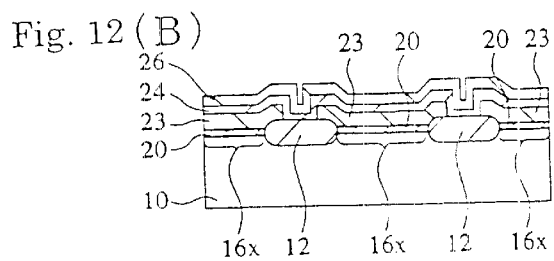
Figure 12:
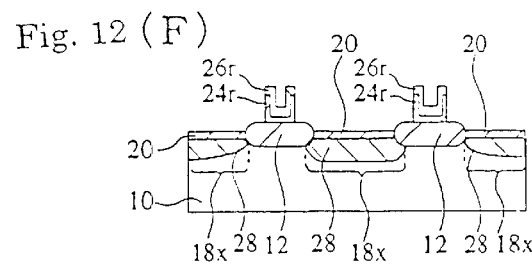
Figure 12:
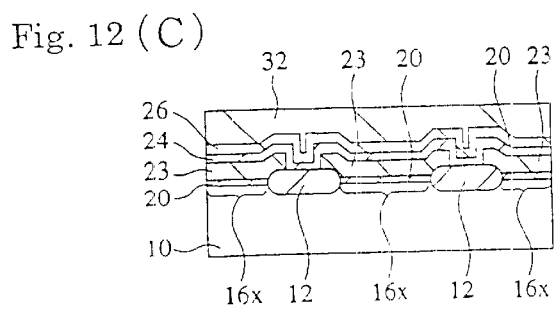
Figure 12:
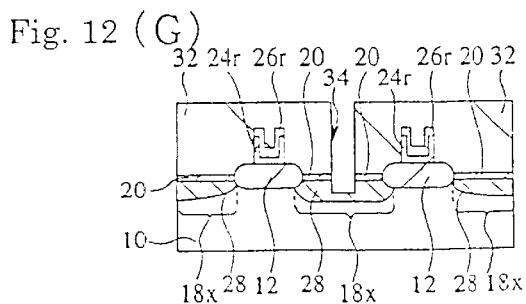
Figure 12:
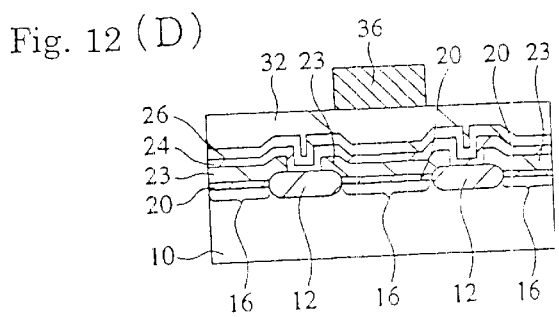
Figure 12:
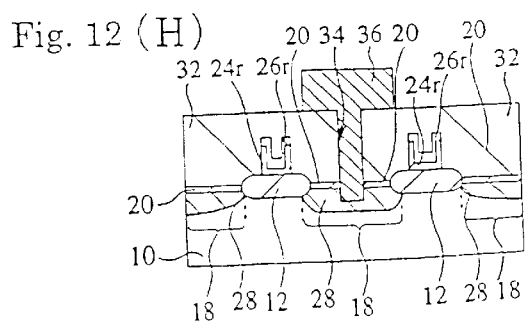

An etching of the interelectrode dielectric layer 24x as shown in FIG. 11(D) and FIG. 11(H), and an etching of the first gate electrode 22s as shown in FIG. 12(A) and 12(E) are further performed using the resist pattern 56 as a mask, so that interelectrode dielectric layer 26r and first gate electrode 24r remain. Therefore, the first gate electrode 22s is formed as shown in FIGS. 11(D), 11(H), 12(A) and 12(E).

The resist pattern 56, which used in the above described etching, is removed. Then, As ions are introduced from the upper side of the substrate 10. A thermal diffusion is performed, and the diffusion layer 28 is formed as shown in FIG. 12(B) and FIG. 12(F).

The intermediate insulating layer 32 is formed over the semiconductor substrate 10, and the contact hole 34 is formed in the intermediate insulating layer 32 as shown in FIG. 12(C) and FIG. 12(G). The interconnection 36 is formed over the intermediate insulating layer 32 as shown in FIG. 12(D) and FIG. 12(H).

In the fifth embodiment, the interelectrode dielectric layer 24r and the second polysilicon layer 26r remain over the isolation layer 12 of the diffusion portion 16. Therefore, these layers protect the isolation layer 12 from the isolation layer reduction, while the etching of the interelectrode dielectric layer 24x is performed. Thus, the isolation layer reduction is prevented. These layers also prevent the introduction of ions under the isolation layer 12 while As ions are introduced.

Sixth embodiment

Figure 13:
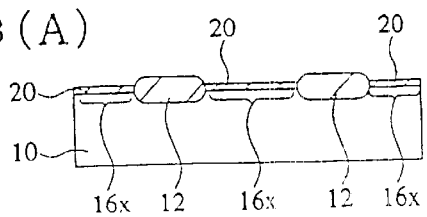
FIGS. 13(A)–(H) show a method for manufacturing of a sixth preferred embodiment.
Figure 13:
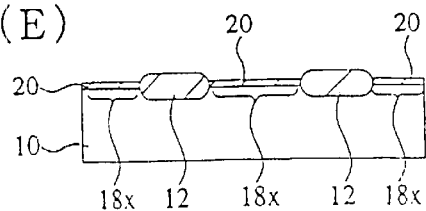
Figure 13:
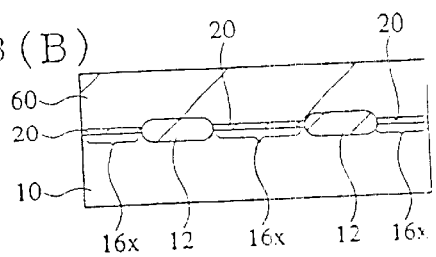
Figure 13:
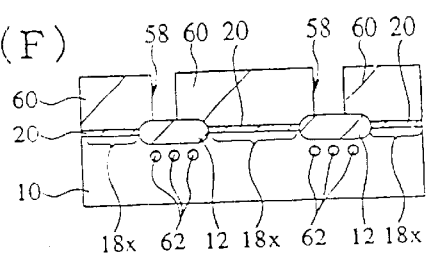
Figure 13:
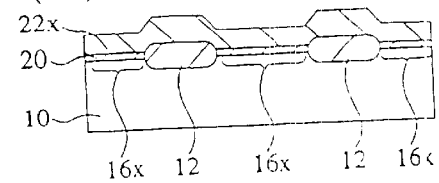
Figure 13:
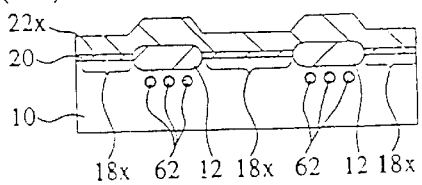
Figure 13:
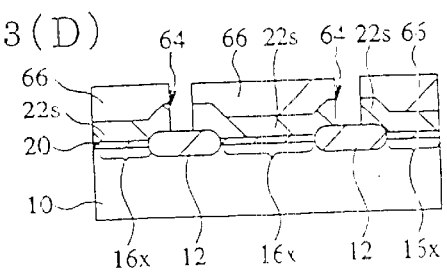
Figure 13:
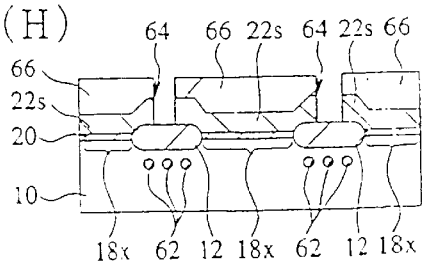

FIGS. 13A)~(H), FIGS. 14(A)~(H) and FIGS. 15(A)~(F) show a method for manufacturing of the sixth preferred embodiment. FIGS. 13A)~(D), FIGS. 14(A)~(D) and FIGS. 15(A)~(C) correspond to the stacked gate portion. FIGS. 13(E)~(H), FIGS. 14(E)~(H) and FIGS. 15(D)~(F) correspond to the diffusion portion. The difference from the other preferred embodiments is mainly described below.

The isolation layer 12 is partly formed over the semiconductor substrate 10, and the stacked gate portion 16x and the diffusion portion 18x are formed. The gate oxide layer 20 is formed over the active region. The gate oxide layer 20 is formed using a thermal oxidation, as shown in FIG. 13(A) and FIG. 13(B). The first polysilicon layer 22 will be subsequently formed over the isolation layer 12 and the gate oxide layer 20, as described with respect to FIG. 13(C) and FIG. 13(G).

In the sixth embodiment, a resist pattern 60 is formed over the silicon substrate. The resist pattern 60 has an opening corresponding to the isolation layer 12 of the diffusion portion 18x.

Then, p-type ions 62 (for example B+) are introduced to the silicon substrate 10 under the isolation layer 12 as shown in FIG. 13(B) and FIG. 13(F). The resist pattern 60 is removed after the introduction of the ions.

Figure 14A:
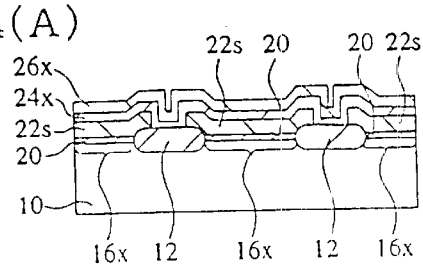
FIGS. 14(A)–(H) show the method for manufacturing of the sixth preferred embodiment.
Figure 14E:
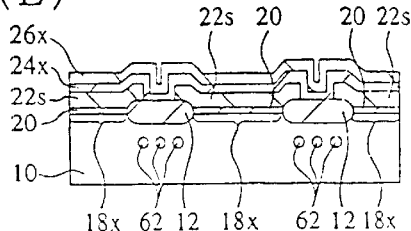
Figure 14B:
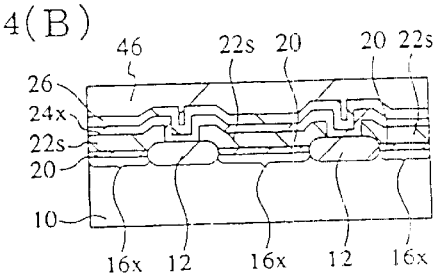
Figure 14F:
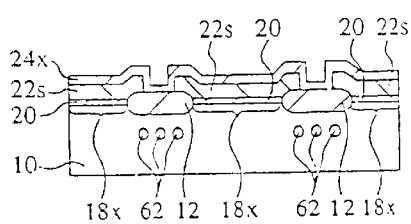

The first polysilicon layer 22x is formed over the whole surface of the silicon substrate 10 using an LP-CVD method as shown in FIG. 13(C) and FIG. 13(G). A resist pattern 66 is formed over the first polysilicon layer 22x. The resist pattern 66 has an opening over the isolation layer 12. A dry etching is performed using the resist pattern 66 as a mask, and the first gate electrode 22s is formed as shown in FIG. 13(D) and FIG. 13(H). An interelectrode dielectric layer 24x is formed over the first gate electrode. The interelectrode dielectric is the same as those of the other preferred embodiments (ONO layer). The second polysilicon layer 26x is formed over the interelectrode dielectric layer 24x as shown in FIG. 14(A) and FIG. 14 (E). The second polysilicon layer 26x over the diffusion portion is removed using mask 46 as shown in FIG. 14(B) and FIG. 14(F).

Figure 14C:
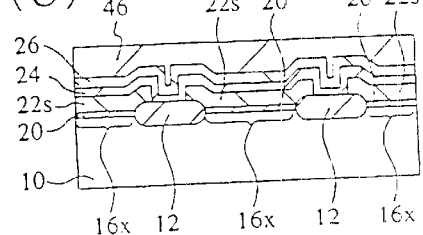
Figure 14G:
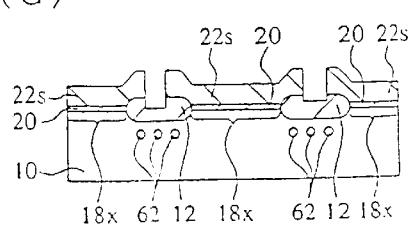
Figure 14D:
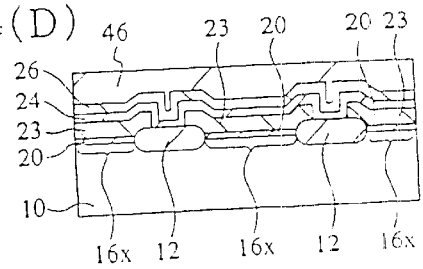
Figure 14H:
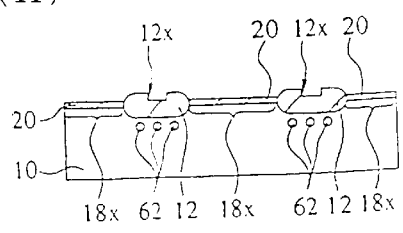

An etching of the interelectrode dielectric layer 24x is performed as illustrated in FIG. 14(C) and FIG. 14(G), and then etching of the first gate electrode 22s is performed as shown in FIG. 14(D) and FIG. 14(H). This etching results in an isolation layer reduction 12x as shown in FIG. 14(H).

The introduction of As ions and the thermal diffusion are the same as those of the other embodiments. (FIG. 15(A) and FIG. 15(D))

Figure 15:
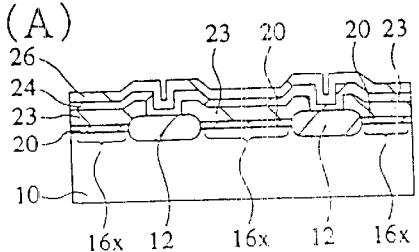
FIGS. 15(A)–(F) show the method for manufacturing of the sixth preferred embodiment.
Figure 15:
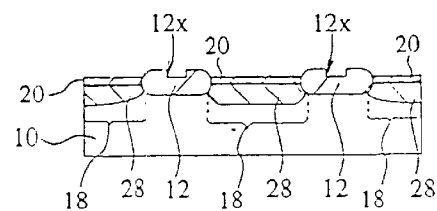
Figure 15:
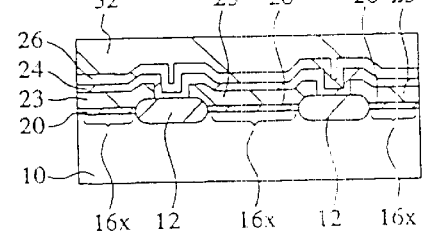
Figure 15:
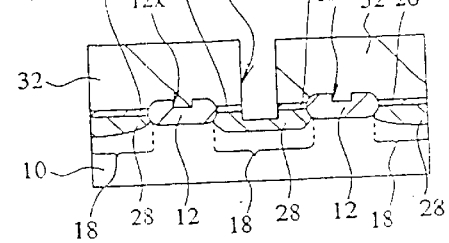
Figure 15:
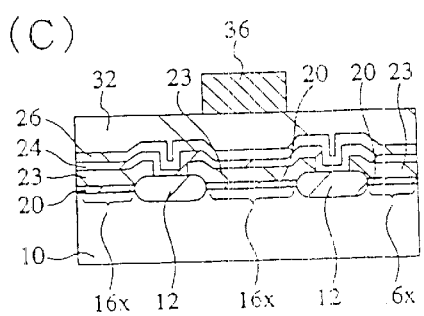
Figure 15:
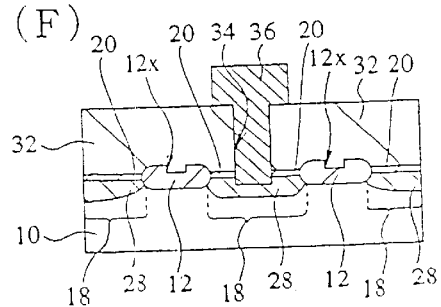

The intermediate insulating layer 32 is formed over the semiconductor substrate 10, and the contact hole 34 is formed in the intermediate insulating layer 32 as shown in FIGS. 15(B) and 15(E). The interconnection 36 if formed over the intermediate insulating layer 32 as shown in FIG. 15(C) and FIG. 15(F).

In the sixth preferred embodiment, the p-type ions are introduced under the isolation layer 12 of the diffusion portion. Therefore, even if the n-type ions are introduced under the isolation layer 12 of the diffusion portion, a conductive type is not changed, and the unnecessary diffusion layer is not formed.

Seventh embodiment

Figure 16:
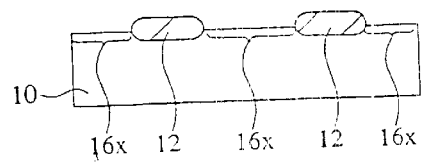
FIGS. 16(A)–(F) show a method for manufacturing of a seventh preferred embodiment.
Figure 16:
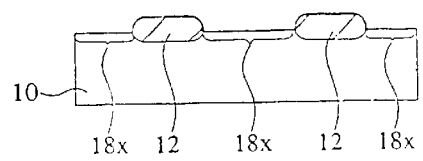
Figure 16:
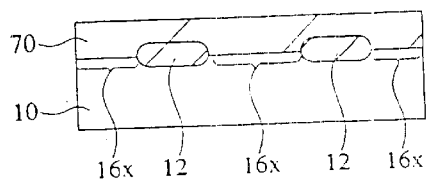
Figure 16:
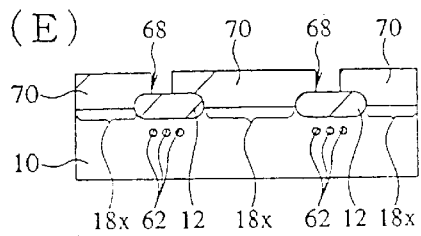
Figure 16:
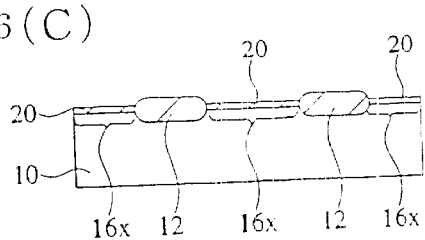
Figure 16:
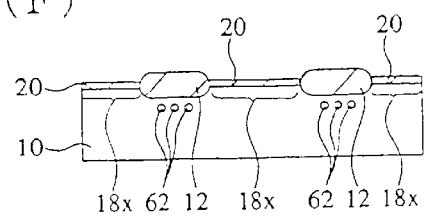

FIGS. 16(A)~(F) show a method for manufacturing the semiconductor memory device of the seventh preferred embodiment. FIGS. 16(A)~(C) correspond to the stacked gate portion. FIGS. 16(D)~(F) correspond to the diffusion portion. The difference between this embodiment and the other preferred embodiments is described below. In particular, the seventh embodiment differs from the sixth preferred embodiment in the order of the process steps.

The isolation layer 12 is partly formed over the semiconductor substrate 10, and the stacked gate portion 16x and the diffusion portion 18x is formed, as shown in FIG. 16(A) and FIG. 16(D).

In the seventh embodiment, a resist pattern 70 is formed over the silicon substrate 10. The resist pattern 70 has an opening 68 corresponding to the isolation layer 12 of the diffusion portion 18x. Then, p-type ions 62 (for example B+) are introduced to the silicon substrate 10 under the isolation layer 12 as shown in FIG. 16(B) and FIG. 16(E). The resist pattern 70 is removed after the introduction of the ions.

The gate oxide layer 20 is formed over the active region after the introduction of p-type ions, as shown in FIG. 16(C) and 16(F). The gate oxide layer 20 is formed using a thermal oxidation. Subsequent steps are the same as those of the sixth preferred embodiment.

In the seventh embodiment, the gate oxide layer is formed over the active region after the introduction of p-type ions. Therefore, the resist pattern is not formed on the gate oxide layer, and the gate oxide is not degraded because of organic materials included in the resist pattern.

Eighth embodiment

FIGS. 17(A)~(H) and FIGS. 18(A)~(H) show a method for manufacturing of the eighth preferred embodiment. FIGS. 17(A)~(D) and FIGS. 18(A)~(D) correspond to the stacked gate portion. FIGS. 17(E)~(H) and FIGS. 18(E)~(H) correspond to the diffusion portion. The difference from the other preferred embodiments is mainly described below.

Figure 17:
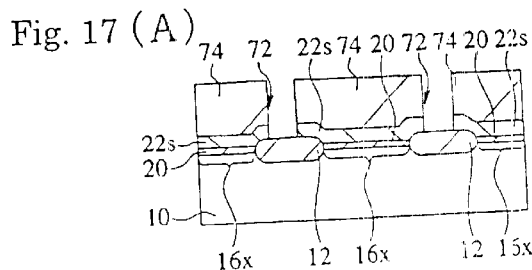
FIGS. 17(A)–(H) show a method for manufacturing of a eighth preferred embodiment.
Figure 17:
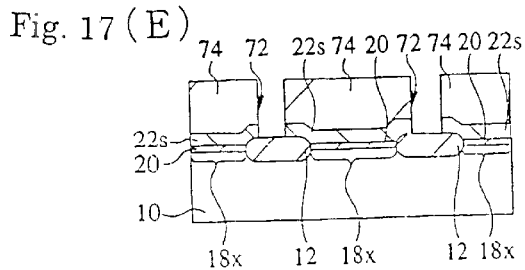
Figure 17:
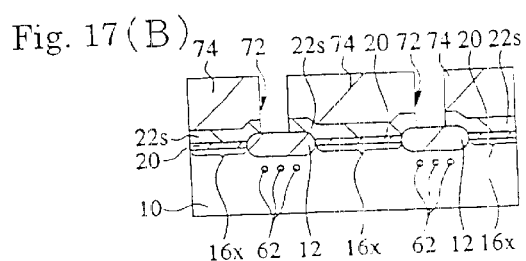
Figure 17:
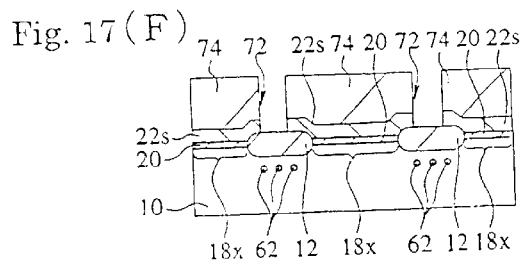
Figure 17:
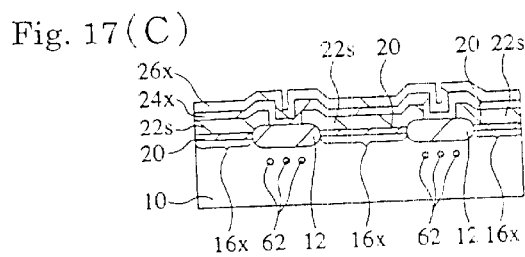
Figure 17:
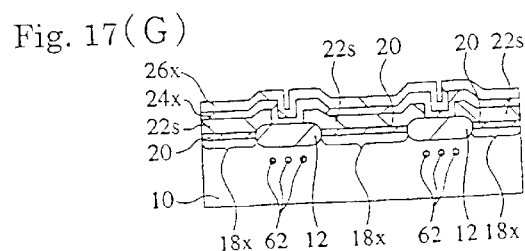
Figure 17:
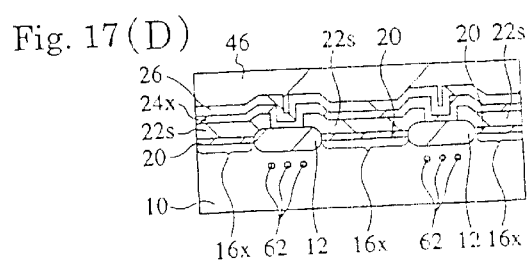
Figure 17:
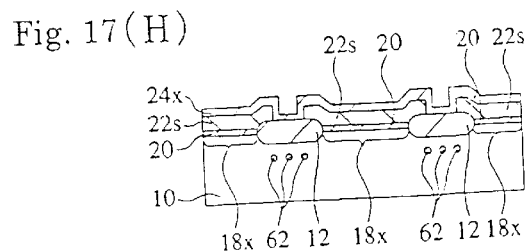
Figure 18:
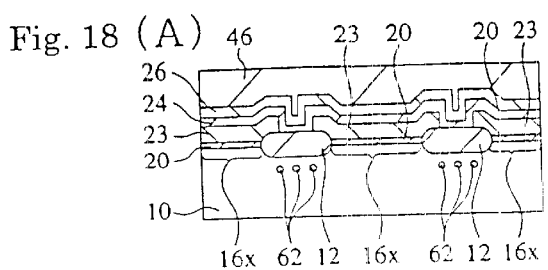
FIGS. 18(A)–(H) show the method for manufacturing of the eighth preferred embodiment.
Figure 18:
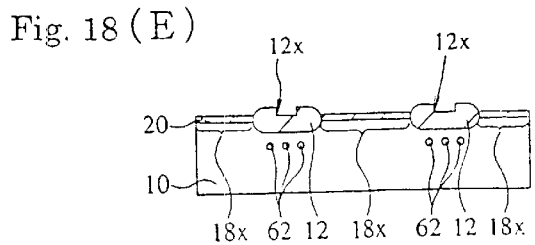
Figure 18:
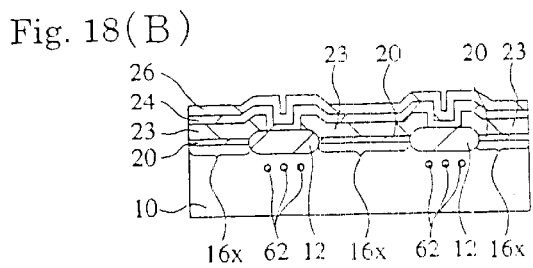
Figure 18:
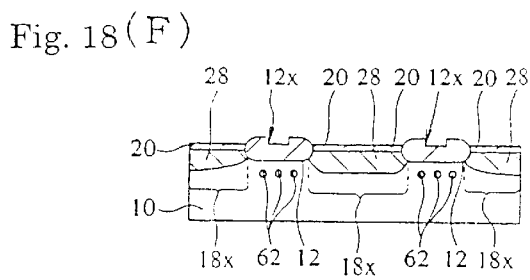
Figure 18:
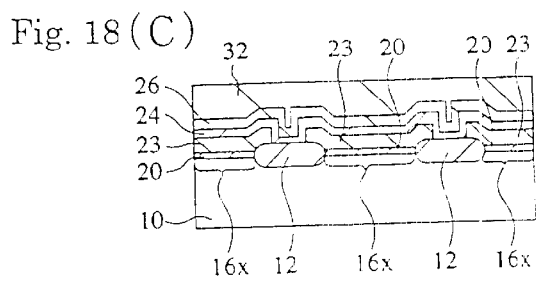
Figure 18:
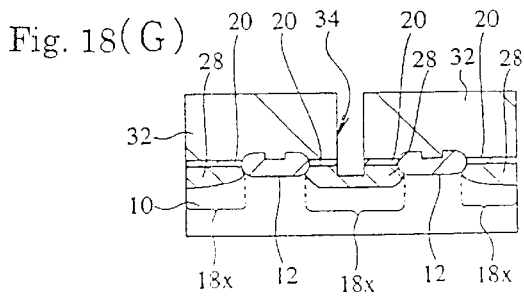
Figure 18:
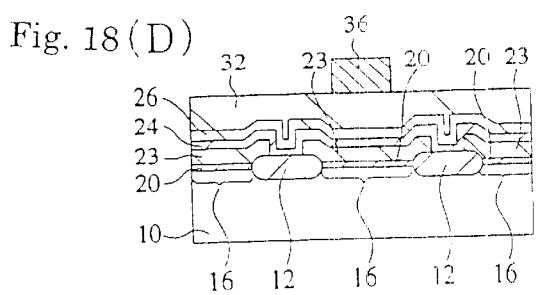
Figure 18:
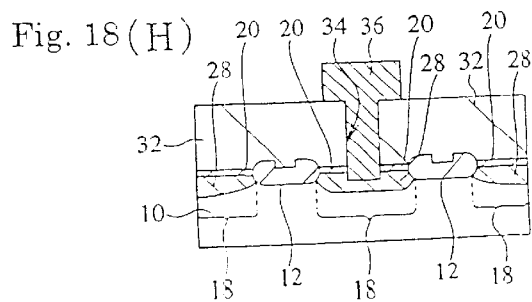
Figure 19:
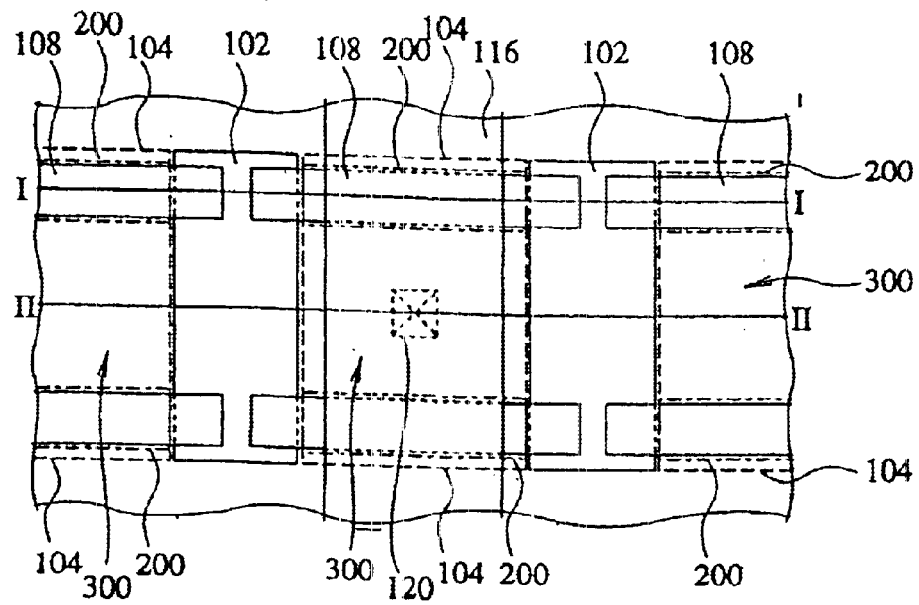
FIG. 19 shows a conventional nonvolatile semiconductor memory device.
Figure 20:
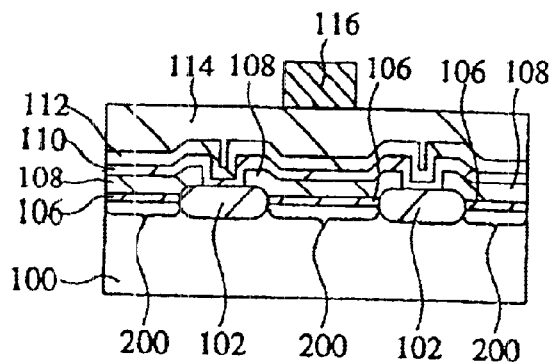
FIGS. 20(A)–(B) shows the conventional nonvolatile semiconductor memory device.
Figure 20:
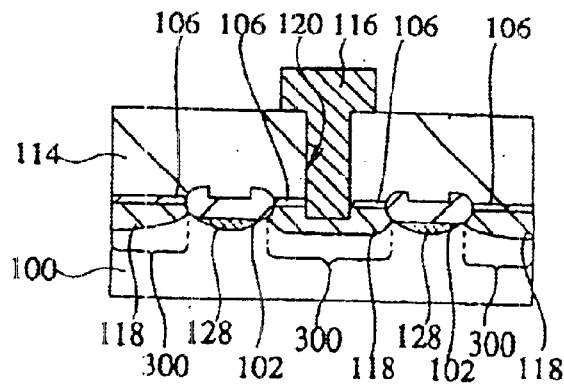
Figure 21A:
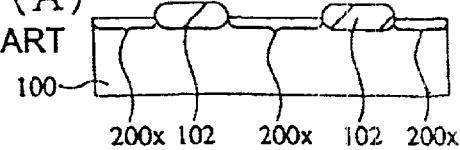
FIGS. 21(A)–(E) correspond to line I—I of FIG. 19.
Figure 21F:
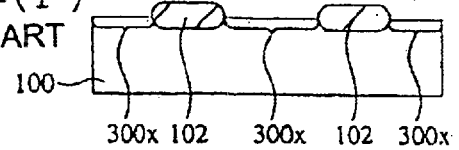
FIGS. 21(F)–(J) correspond to line II—II of FIG. 19.
Figure 21B:
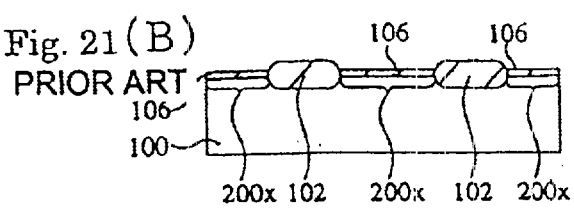
Figure 21G:
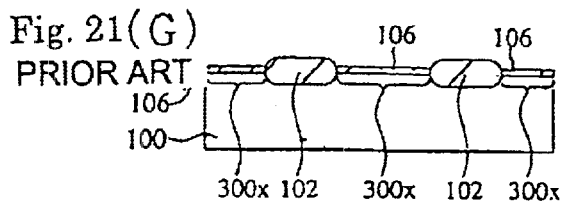
Figure 21C:
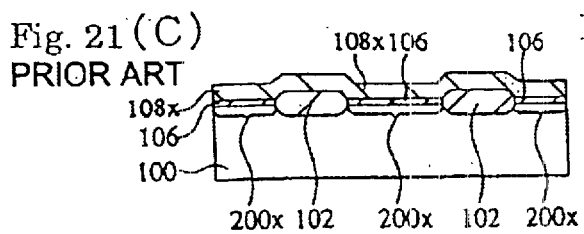
Figure 21H:
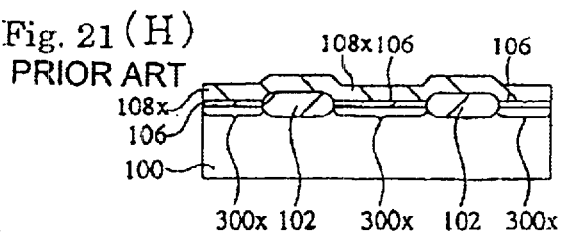
Figure 21D:
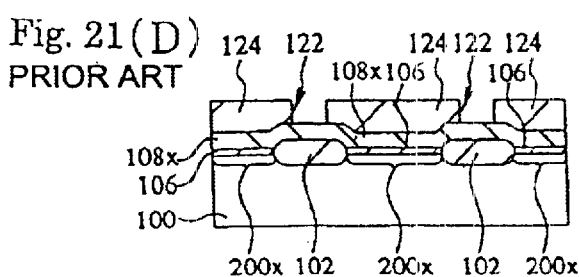
Figure 21I:
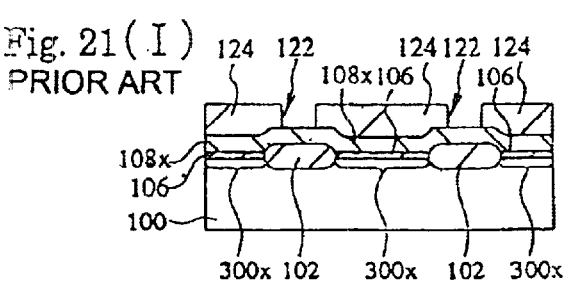
Figure 21E:
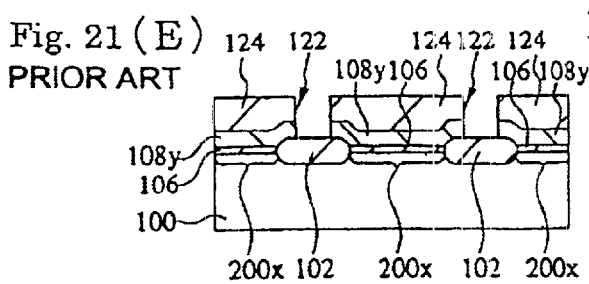
Figure 21J:
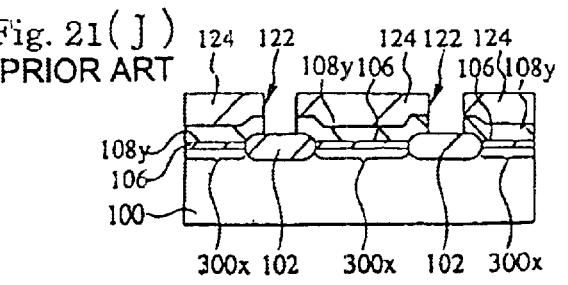
Figure 22A:
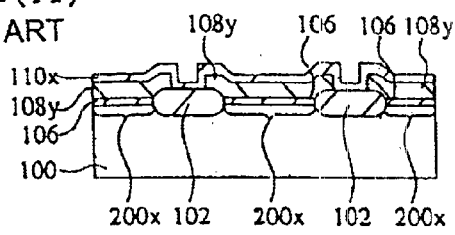
FIGS. 22(A)–(H) show the method for manufacturing the conventional nonvolatile semiconductor memory.
Figure 22E:
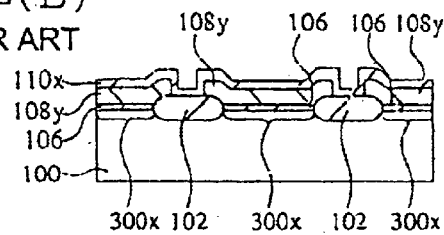
Figure 22B:
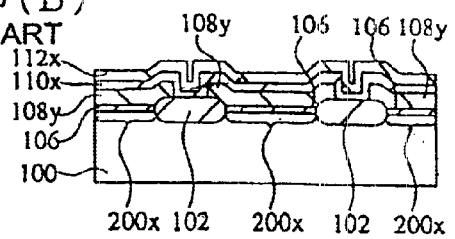
Figure 22F:
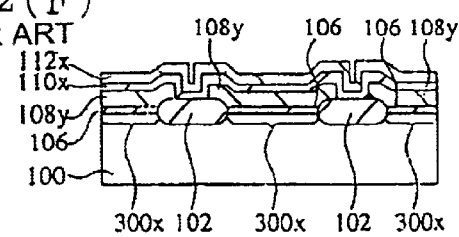
Figure 22C:
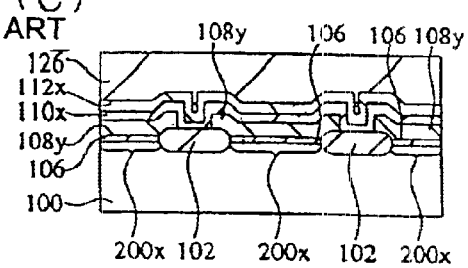
Figure 22G:
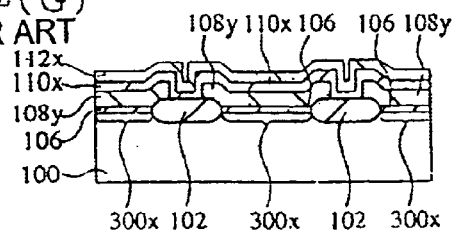
Figure 22D:
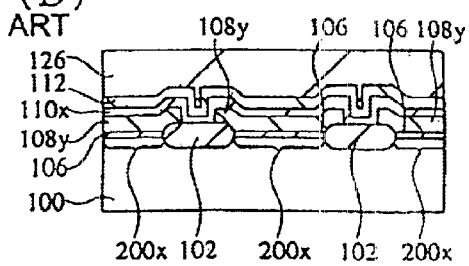
Figure 22H:
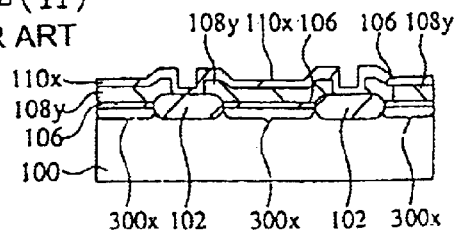

The steps before the formation of the first polysilicon layer 22s in FIG. 17(A) and FIG. 17(E) are the same as the first embodiments. Then, the first polysilicon layer 22s is formed over the whole surface of the silicon substrate 10 by using an LP-CVD method.

A resist pattern 74 is formed over the first polysilicon layer 22s. The resist pattern 74 has an opening 72 over the isolation layer 12. A dry etching is performed using the resist pattern as a mask, and the first gate electrode 22s is formed. Then, p-type ions 62 (for example B+) are introduced to the silicon substrate 10 under the isolation layer 12 as shown in FIG. 17(B) and FIG. 17(F). The resist pattern 74 is removed after the introduction of the ions. Subsequent steps in FIGS. 17(C), 17(G), 17(D) and 17(H) are the same as those of the sixth preferred embodiment.

In the eighth embodiment, the introduction of p-type ions is performed after the etching of the first polysilicon layer. Therefore, the resist pattern used for etching is commonly used for the introduction of p-type ions, and the steps associated with forming a resist patterns can be decreased.

As described above, according to the embodiments of the present invention, the isolation layer is prevented from the isolation layer reduction because of the tapered side surface of the first gate electrode. The area of the side surface of the first gate electrode is increased and thus a higher capacitance ratio can be obtained. The isolation layer is prevented from the isolation layer reduction because of the formation of the resist pattern over the isolation layer. The unnecessary diffusion layer is not formed because of introduction of the opposite type ions before formation of the diffusion layer.

Although the preferred embodiment of the present invention has been described in detail, it should be noted understood that various changes, substitutions and alternations can be made therein without departing from spirit and scope of the inventions as defined by the appended claims.

What is claimed is:

1. A method for manufacturing a semiconductor memory device comprising:

forming an isolation layer over a semiconductor substrate having a stacked gate region and a diffusion region, the isolation layer formed adjacent the diffusion region of the semiconductor substrate;

forming a gate oxide layer over the stacked gate region;

forming a first conductive layer over the isolation layer, the gate oxide layer and the diffusion region;

forming a nitride layer over the first conductive layer, the nitride layer having an opening at the isolation layer;

forming an oxide region in the first conductive layer using the nitride layer as a mask;

removing the nitride layer and the oxide region;

forming an interelectrode dielectric layer over the first conductive layer;

forming a second conductive layer over the interelectrode dielectric layer;

removing the second conductive layer over the diffusion region;

removing the interelectrode dielectric layer over the diffusion region;

removing the first conductive layer over the diffusion region; and forming a diffusion layer in the semiconductor substrate of the diffusion region.

2. A method for manufacturing a semiconductor memory device comprising:

forming an isolation layer over a semiconductor substrate having a stacked gate region and a diffusion region, the isolation layer formed adjacent the diffusion region of the semiconductor substrate;

forming a gate oxide layer over the stacked gate region;

forming a first conductive layer over the isolation layer, the gate oxide layer and the diffusion region;

forming a resist pattern over the first conductive layer, the resist pattern having an opening at a portion corresponding to the isolation layer;

etching the first conductive layer using the resist pattern as a mask, the etching being a wet etching;

removing the resist pattern;

forming an interelectrode dielectric layer over the first conductive layer;

forming a second conductive layer over the interelectrode dielectric layer;

removing the second conductive layer over the diffusion region;

removing the interelectrode dielectric layer over the diffusion region;

removing the first conductive layer over the diffusion region; and forming a diffusion layer in the diffusion region.

3. The method for manufacturing a semiconductor memory device as claimed in claim 2, wherein a tapered portion of the first conductive layer remains on a peripheral portion of the isolation layer after said etching.

4. A method for manufacturing a semiconductor memory device comprising:

forming an isolation layer over a semiconductor substrate having a stacked gate region and a diffusion region, the isolation layer formed adjacent the diffusion region of the semiconductor substrate;

forming a gate oxide layer over the stacked gate region;

forming a first conductive layer over the isolation layer, the gate oxide layer and the diffusion region;

forming a resist pattern over the first conductive layer, the resist pattern having an opening at a portion corresponding to the isolation layer;

etching the first conductive layer using the resist pattern as a mask;

forming an interelectrode dielectric layer over the first conductive layer;

forming a second conductive layer over the interelectrode dielectric layer;

removing the second conductive layer over the diffusion region;

removing the interelectrode dielectric layer over the diffusion region using a wet etching;

removing the first conductive layer over the diffusion region; and forming a diffusion layer in the diffusion region.

5. The method for manufacturing a semiconductor memory device as claimed in claimed 4, wherein the wet etching is an isotropic etching.

6. A method for manufacturing a semiconductor memory device comprising:

forming an isolation layer over a semiconductor substrate having a stacked gate region and a diffusion region, the isolation layer formed adjacent the diffusion region of the semiconductor substrate;

forming a gate oxide layer over the stacked gate region;

forming a first conductive layer over the isolation layer, the gate oxide layer and the diffusion region;

forming a first resist pattern over the first conductive layer, the resist pattern having an opening at a portion corresponding to the isolation layer;

etching the first conductive layer using the first resist pattern as a mask;

forming an interelectrode dielectric layer over the first conductive layer;

forming a second conductive layer over the interelectrode dielectric layer;

removing the second conductive layer over the diffusion region;

removing the interelectrode dielectric layer over the diffusion region;

removing the first conductive layer over the diffusion region;

forming a second resist pattern at a portion corresponding to the isolation layer of the diffusion region; and introducing ions to the diffusion region using the second resist pattern as a mask.

7. A method for manufacturing a semiconductor memory device comprising:

forming an isolation layer over a semiconductor substrate having a stacked gate region and a diffusion region, the isolation layer formed adjacent the diffusion region of the semiconductor substrate;

forming a gate oxide layer over the stacked gate region;

forming a first conductive layer over the isolation layer, the gate oxide layer and the diffusion region;

forming a first resist pattern over the first conductive layer, the first resist pattern having an opening at a portion corresponding to the isolation layer;

etching the first conductive layer using the first resist pattern as a mask;

forming an interelectrode dielectric layer over the first conductive layer;

forming a second conductive layer over the interelectrode dielectric layer;

forming a second resist pattern at a portion corresponding to the stacked gate region and the isolation layer in the diffusion region;

removing the second conductive layer over the diffusion region using the second resist pattern as a mask;

removing the interelectrode dielectric layer using the second resist pattern as a mask;

removing the first conductive layer over the diffusion region; and introducing ions to the diffusion region.

8. The method for manufacturing a semiconductor memory device as claimed in claim 7, wherein during said introducing ions, portions of the second conductive layer and the interelectrode dielectric layer remaining over the isolation layer in the diffusion portion protect the isolation layer.

9. The method for manufacturing a semiconductor memory device as claimed in claim 7, further comprising removing the second resist pattern used as the mask in the diffusion region before said introducing ions.

10. The method for manufacturing a semiconductor memory device as claimed in claim 7, said introducing ions is performed after said removing the second conductive layer, said removing the interelectrode dielectric layer and said removing the first conductive layer.

11. A method for manufacturing a semiconductor memory device comprising:

forming an isolation layer over a semiconductor substrate having a stacked gate region and a diffusion region, the isolation layer formed adjacent the diffusion region of the semiconductor substrate;

forming a gate oxide layer over the stacked gate region;

forming a resist pattern over the semiconductor substrate, the resist pattern having an opening over the isolation layer of the diffusion region;

introducing a first conductive type ion into the semiconductor substrate using the resist pattern as a mask;

forming a first conductive layer over the isolation layer, the gate oxide layer and the diffusion region;

forming an interelectrode dielectric layer over the first conductive layer;

forming a second conductive layer over the interelectrode dielectric layer;

removing the second conductive layer over the diffusion region;

removing the interelectrode dielectric layer over the diffusion region;

removing the first conductive layer over the diffusion region; and introducing a second conductive type ion to the diffusion region.

12. The method for manufacturing a semiconductor memory device as claimed in claim 6, wherein the forming a resist pattern over the semiconductor substrate is performed before forming the gate oxide layer.

13. A method for manufacturing a semiconductor memory device comprising:
- forming an isolation layer over a semiconductor substrate having a stacked gate region and a diffusion region, the isolation layer formed adjacent the diffusion region of the semiconductor substrate;
- forming a gate oxide layer over the stacked gate region;
- forming a first conductive layer over the isolation layer, the gate oxide layer and the diffusion region;
- forming a resist pattern over the first conductive layer, the resist pattern having an opening over the isolation layer;
- etching the first conductive layer using the resist pattern as a mask;
- introducing a first conductive type ion into the semiconductor substrate using the resist pattern as a mask;
- forming an interelectrode dielectric layer over the first conductive layer;
- forming a second conductive layer over the interelectrode dielectric layer;
- removing the second conductive layer over the diffusion region;
- removing the interelectrode dielectric layer over the diffusion region;
- removing the first conductive layer over the diffusion region; and
- introducing a second conductive type ion to the diffusion region.

* * * * *